(12) United States Patent
Hsueh et al.

(10) Patent No.: US 11,901,256 B2
(45) Date of Patent: Feb. 13, 2024

(54) SEMICONDUCTOR DEVICE, SEMICONDUCTOR PACKAGE, AND METHODS OF MANUFACTURING THE SAME

(71) Applicant: Taiwan Semiconductor Manufacturing Company, Ltd., Hsinchu (TW)

(72) Inventors: Chang-Jung Hsueh, Taipei (TW); Cheng-Nan Lin, Hsinchu (TW); Wan-Yu Chiang, Hsinchu (TW); Wei-Hung Lin, Hsinchu County (TW); Ching-Wen Hsiao, Hsinchu (TW); Ming-Da Cheng, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 206 days.

(21) Appl. No.: 17/461,999

(22) Filed: Aug. 31, 2021

(65) Prior Publication Data

US 2023/0068485 A1 Mar. 2, 2023

(51) Int. Cl.
*H01L 23/31* (2006.01)
*H01L 23/522* (2006.01)
(Continued)

(52) U.S. Cl.
CPC ......... *H01L 23/3185* (2013.01); *H01L 21/78* (2013.01); *H01L 23/49822* (2013.01);
(Continued)

(58) Field of Classification Search
CPC ................. H01L 23/3185; H01L 21/78; H01L 23/49822; H01L 23/5226; H01L 24/73;
(Continued)

(56) References Cited

U.S. PATENT DOCUMENTS

| 8,993,380 B2 | 3/2015 | Hou et al. |
| 9,000,584 B2 | 4/2015 | Lin et al. |

(Continued)

FOREIGN PATENT DOCUMENTS

| TW | 201322391 | 6/2013 |
| TW | 201411745 | 3/2014 |

OTHER PUBLICATIONS

"Office Action of Taiwan Counterpart Application", dated Dec. 5, 2022, pp. 1-9.

*Primary Examiner* — Elias Ullah
(74) *Attorney, Agent, or Firm* — JCIPRNET

(57) ABSTRACT

A semiconductor device includes a substrate, an interconnect structure, and conductive vias. The substrate has a first side, a second side and a sidewall connecting the first side and the second side, wherein the sidewall includes a first planar sidewall of a first portion of the substrate, a second planar sidewall of a second portion of the substrate and a curved sidewall of a third portion of the substrate, where the first planar sidewall is connected to the second planar sidewall through the curved sidewall. The interconnect structure is located on the first side of the substrate, where a sidewall of the interconnect structure is offset from the second planar sidewall. The conductive vias are located on the interconnect structure, where the interconnect structure is located between the conductive vias and the substrate.

20 Claims, 14 Drawing Sheets

(51) Int. Cl.
*H01L 23/498* (2006.01)
*H01L 23/00* (2006.01)
*H01L 21/78* (2006.01)

(52) U.S. Cl.
CPC .......... *H01L 23/5226* (2013.01); *H01L 24/73* (2013.01); *H01L 24/94* (2013.01); *H01L 2224/73204* (2013.01)

(58) Field of Classification Search
CPC .......... H01L 24/94; H01L 2224/73204; H01L 23/3128; H01L 23/3114; H01L 23/49816; H01L 24/03; H01L 24/05; H01L 24/06; H01L 24/11; H01L 24/17; H01L 24/14; H01L 24/13; H01L 24/16; H01L 24/32; H01L 24/48; H01L 24/81; H01L 24/83; H01L 24/92; H01L 2224/0401; H01L 2224/05572; H01L 2224/06102; H01L 2224/06517; H01L 2224/11002; H01L 2224/11462; H01L 2224/11464; H01L 2224/11622; H01L 2224/11849; H01L 2224/14517; H01L 2224/16227; H01L 2224/16235; H01L 2224/16237; H01L 2224/26145; H01L 2224/32145; H01L 2224/32225; H01L 2224/48227; H01L 2224/73265; H01L 2224/81005; H01L 2224/83005; H01L 2224/92125; H01L 2224/94; H01L 2224/95; H01L 2225/0651; H01L 2225/06568; H01L 2225/1023; H01L 2225/1058; H01L 2924/10156; H01L 2924/15311; H01L 2924/18161; H01L 23/528; H01L 23/535
See application file for complete search history.

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |

SEMICONDUCTOR DEVICE, SEMICONDUCTOR PACKAGE, AND METHODS OF MANUFACTURING THE SAME

BACKGROUND

Semiconductor devices and integrated circuits (ICs) are used in a variety of electronic applications, such as personal computers, cell phones, digital cameras, and other electronic equipment. For example, the semiconductor devices and ICs are typically manufactured on a single semiconductor wafer. The dies of the wafer may be processed and packaged with other semiconductor devices, dies or components at the wafer level or after wafer-sawing, and various technologies have been developed.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
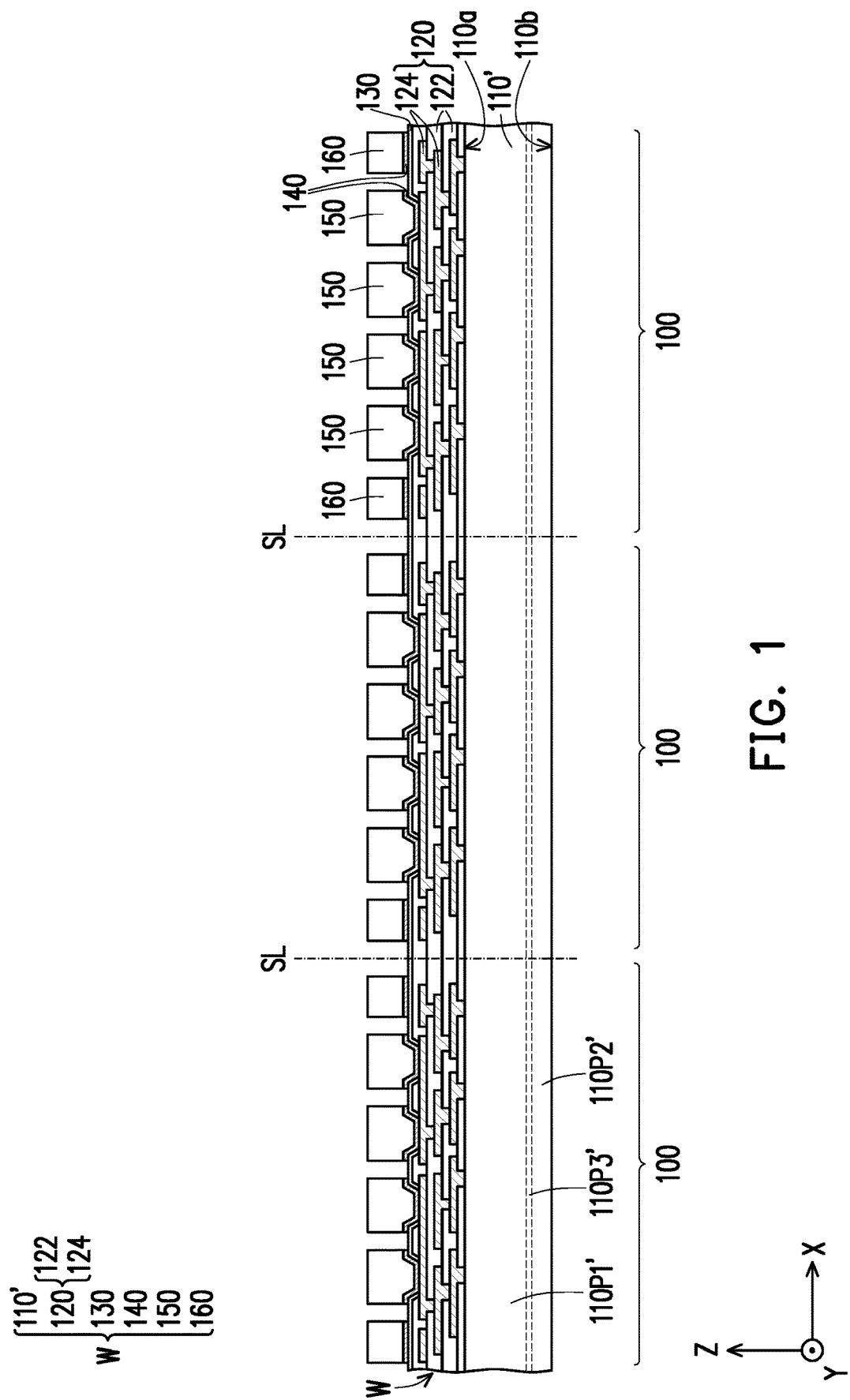
FIG. 1 to FIG. 4 are schematic cross-sectional views of various stages in a manufacturing process of a semiconductor device in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 4 are schematic cross-sectional views of various stages in a manufacturing process of a semiconductor device in accordance with some embodiments of the disclosure. FIG. 5 is a flow chart illustrating a method of manufacturing a semiconductor device in accordance with some embodiments of the disclosure. In embodiments, the manufacturing method is part of a wafer level packaging process. It is to be noted that the process steps described herein cover a portion of the manufacturing processes used to fabricate a semiconductor component such as a semiconductor device (or chip/die) or a semiconductor package. The embodiments are intended to provide further explanations but are not used to limit the scope of the disclosure. In FIG. 1 to FIG. 4, multiple semiconductor devices are shown to represent plural semiconductor devices interconnected in one wafer, and a single semiconductor device is shown to represent plural semiconductor devices separated from one another obtained following the (semiconductor) manufacturing method, however the disclosure is not limited thereto.

Referring to FIG. 1, in some embodiments, a wafer W is provided, in accordance with a step S10 of FIG. 5. The wafer W may be a semiconductor wafer. In some embodiments, if considering a top view along a direction Z, the wafer W is in a wafer or panel form. In other words, the wafer W is processed in the form of a reconstructed wafer/panel. The wafer W may be in a form of wafer-size having a diameter of about 4 inches or more. The wafer W may be in a form of wafer-size having a diameter of about 6 inches or more. The wafer W may be in a form of wafer-size having a diameter of about 8 inches or more. Or alternatively, the wafer W may be in a form of wafer-size having a diameter of about 12 inches or more. In some embodiments, the wafer W includes a plurality of semiconductor devices 100 arranged in a form of an array along a direction X and a direction Y. The direction X, the direction Y and the direction Z may be different from each other. For example, the direction X is perpendicular to the direction Y, and the direction X and the direction Y are independently perpendicular to the direction Z, as shown in FIG. 1. In the disclosure, the direction Z may be referred to as a stacking direction, and an X-Y plane defined by the direction X and the direction Y may be referred to as a plane view or top view.

Before a wafer sawing or dicing process along a scribe line SL (shown as the dotted line in FIG. 1 through FIG. 3) is performed on the wafer W, the semiconductor devices 100 of the wafer W are connected one another, as shown in FIG. 1. In FIG. 1, only three semiconductor devices 100 are shown in FIG. 1 for illustration, and not limited thereto. In the disclosure, each semiconductor device 100 may be referred to as a semiconductor die, a semiconductor chip, or an integrated circuit (IC). It should be appreciated that the illustration of the semiconductor devices 100 and other components throughout all figures is schematic and is not in scale.

For example, the wafer W includes a wafer substrate 110' having semiconductor components formed therein or thereon, an interconnect structure 120 disposed on the wafer substrate 110', a passivation layer 130 disposed on and partially exposing the interconnect structure 120, connecting pads 140 disposed on the interconnect structure 120 and the passivation layer 130, connecting terminals 150 disposed on and electrically connected to the interconnect structure 120, and dummy terminals 160 disposed on and electrically isolated to the interconnect structure 120. The wafer substrate 110' may be a semiconductor substrate. The interconnect structure 120 covers the wafer substrate 110' and are electrically connected to the semiconductor components formed in or on the wafer substrate 110'.

In some embodiments, the wafer substrate 110' includes a bulk semiconductor, a semiconductor-on-insulator (SOI) substrate, other supporting substrate (e.g., quartz, glass, etc.), combinations thereof, or the like, which may be doped or undoped. In some embodiments, the wafer substrate 110' includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), etc.), combinations thereof, or other suitable materials. The compound semiconductor substrate may have a multilayer structure, or the substrate may include a multilayer compound semiconductor structure. The alloy SiGe may be formed over a silicon substrate. The SiGe substrate may be strained. In some embodiments, a thickness of the wafer substrate 110' is greater than or substantially equal to 400 µm, in the direction Z. For example, the thickness of the wafer substrate 110' is approximately ranging from about 400 µm to 1500 µm.

In some embodiments, the semiconductor components include the active components (such as transistors, diodes, etc.), passive components (such as capacitors, resistors, inductors, etc.), and/or other suitable electrical components. In some embodiments, the semiconductor components are formed at an active surface 110a of the wafer substrate 110' proximal to the interconnect structure 120. In some embodiments, as shown in FIG. 1, the wafer substrate 110' has the active surface 110a and a bottom surface 110b opposite to the active surface 110a, and the interconnect structure 120 is disposed on and covers the active surface 110a of the wafer substrate 110'. In some embodiments, the wafer substrate 110' has a first sub-portion 110P1', a second sub-portion 110P2' and a third sub-portion 110P3', where the third sub-portion 110P3' is interposed between the first sub-portion 110P1' and the second sub-portion 110P2'.

The wafer substrate 110' may further include circuitry (not shown) formed in a front-end-of-line (FEOL) fabrication processes of the wafer W to provide routing functions to the semiconductor components for internal connections, and the interconnect structure 120 may be formed in a back-end-of-line (BEOL) fabrication processes of the wafer W for providing further routing functions to the semiconductor components for external connections. In some embodiments, in such BEOL fabrication process, the interconnect structure 120 includes an inter-layer dielectric (ILD) layer formed over the wafer substrate 110' and covering the semiconductor components, and an inter-metallization dielectric (IMD) layer formed over the ILD layer. In some embodiments, the ILD layer and the IMD layer are formed of a low-K dielectric material or an extreme low-K (ELK) material, such as an oxide, silicon dioxide, boron-doped phosphosilicate glass (BPSG), phosphosilicate glass (PSG), fluorinated silicate glass (FSG), SiOxCy, Spin-On-Glass, Spin-On-Polymers, silicon carbon material, compounds thereof, composites thereof, combinations thereof, or the like. The ILD layer and the IMD layer may include any suitable number of dielectric material layers which is not limited thereto.

In some embodiments, the interconnect structure 120 includes one or more dielectric layers 122 and one or more metallization layers 124 in alternation. The metallization layers 124 may be embedded in the dielectric layers 122. In some embodiments, the interconnect structure 120 is electrically coupled to the semiconductor components formed in and/or on the wafer substrate 110' and electrically coupled to external components (e.g., test pads, bonding conductors, etc.) formed thereon. For example, the metallization layers 124 in the dielectric layers 122 route electrical signals between the semiconductor components of the wafer substrate 110' and route electrical signals between the semiconductor components of the wafer substrate 110' and the external components. In some embodiments, the semiconductor components and the metallization layers 124 are interconnected to perform one or more functions including memory structures (e.g., a memory cell), processing structures (e.g., a logic cell), input/output (I/O) circuitry (e.g. an I/O cell), or the like. In some embodiments, as shown in FIG. 1, the outermost layer of the dielectric layers 122 (referred to as an outermost dielectric layer) has openings exposing portions of a topmost layer of the metallization layers 124 for further electrical connection.

The dielectric layers 122 may be polyimide, polybenzoxazole (PBO), benzocyclobutene (BCB), a nitride such as silicon nitride, an oxide such as silicon oxide, phosphosilicate glass (PSG), borosilicate glass (BSG), BPSG, a combination thereof or the like, which may be patterned using a photolithography and/or etching process. In some embodiments, the dielectric layers 122 are formed by suitable fabrication techniques such as spin-on coating, chemical vapor deposition (CVD), plasma-enhanced chemical vapor deposition (PECVD) or the like.

The metallization layers 124 may be made of conductive materials formed by electroplating or deposition, such as copper, copper alloy, aluminum, aluminum alloy, or combinations thereof, which may be patterned using a photolithography and etching process. In some embodiments, the metallization layers 124 are patterned copper layers or other suitable patterned metal layers. The metallization layers 124 may be metal lines, metal vias, metal pads, metal traces, or combinations thereof, etc. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. The numbers of the dielectric layers 122 and the number of the metallization layers 124 are not limited in the disclosure, and may be selected and designated based on demand and design layout/requirement.

In some embodiments, as shown in FIG. 1, the passivation layer 130 covers the interconnect structure 120 and includes a plurality of openings exposing the portions of the topmost layer of the metallization layers 124 exposed by the openings formed in the outermost layer of the dielectric layers 122. The passivation layer 130 may be made of one or more suitable dielectric materials such as an inorganic dielectric material (such as silicon oxide, silicon nitride, silicon oxynitride), an organic dielectric material (such as polyimide (PI), PBO), a low-k dielectric material, combinations of these, or the like. The passivation layer 130 may be patterned using a photolithography and/or etching process. In some embodiments, the passivation layer 130 are formed by suitable fabrication techniques such as spin-on coating, CVD, PECVD or the like. If considering the outermost layer of the dielectric layers 122 may serve as a passivation layer made of one or more suitable dielectric materials such as silicon oxide, silicon nitride, silicon oxy-nitride or other suitable inorganic dielectric materials, the passivation layer 130 may serve as a post-passivation layer made of one or more suitable dielectric materials such as PI, PBO, or other suitable organic dielectric materials. The disclosure is not limited thereto. In alternative embodiments, the passivation layer 130 is omitted.

Continued on FIG. 1, in some embodiments, the connecting pads 140 are formed over the interconnect structure 120 and on the passivation layer 130, and a plurality of connecting terminals 150 and a plurality of dummy terminals 160 are formed on the plurality of the connecting pads 140. For example, some of the connecting pads 140 are formed through the openings formed in the passivation layer 130 and the openings formed in the outermost layer of the dielectric layers 122 to contact the topmost layer of the metallization layers 124 of the interconnect structure 120 exposed therefrom for testing and/or further electrical connection. On the other hand, some other of the connecting pads 140 are formed on the passivation layer 130 over the outermost layer of the dielectric layers 122 without contacting the topmost layer of the metallization layers 124 of the interconnect structure 120. The connecting pads 140 contacting the topmost layer of the metallization layers 124 of the interconnect structure 120 may be referred to as under bump metallurgies (UBMs).

As shown in FIG. 1, for example, the connecting terminals 150 are located on and electrically connect to the connecting pads 140 contacting the topmost layer of the metallization layers 124 of the interconnect structure 120. The connecting terminals 150 may be referred to as conductive vias of the semiconductor devices 100. As shown in FIG. 1, for example, the dummy terminals 160 are located on and electrically connect to the connecting pads 140 spacing apart from the topmost layer of the metallization layers 124 of the interconnect structure 120 by the passivation layer 130 and the outermost layer of the dielectric layers 122. The dummy terminals 160 may be referred to as alignment marks of the semiconductor devices 100 for indications of placements of the semiconductor devices 100 in sequential processes or of positions of the scribe lines SL in the wafer sawing or dicing processes. In addition, owing to the dummy terminals 160, a mechanical strength is enhanced after the semiconductor device 100 is bonded to another semiconductor device or carrier (such as circuit carrier or the like). However, the disclosure is not limited thereto; alternatively, the dummy terminals 160 may be omitted.

For example, the formation of the connecting pads 140, the connecting terminals 150 and the dummy terminals 160 includes, but not limited to, a seed layer (not shown) is conformally and entirely formed over the passivation layer 130 and extends into the openings formed in the passivation layer 130 to be in contact with the topmost layer of the metallization layers 124. In some embodiments, the seed layer is a metal layer, which may be a single layer or a composite layer comprising a plurality of sub-layers formed of different materials. In some embodiments, the seed layer comprises a titanium layer and a copper layer over the titanium layer, or two titanium layers and a cupper layer sandwiched between the two titanium layers. The seed layer may be formed using, for example, sputtering or the like.

A photo resist (not shown) is then formed and patterned on the seed layer, for example. The photo resist may be formed by spin coating or the like, and may be exposed to light for patterning. In some embodiments, a material of the photo resist includes a positive resist material or a negative resist material, that is suitable for a patterning process such as a photolithography process with a mask or a mask-less photolithography process (such as an electron-beam (e-beam) writing or an ion-beam writing). In the disclosure, the photo resist may be referred to as a photoresist layer or a resist layer. In some embodiments, the pattern of the photo resist is corresponding to the positioning locations of the connecting terminals 150 and the dummy terminals 160. For example, the photo resist is patterned to obtain the pattern having a plurality of through holes exposing the seed layer located underneath, where the connecting terminals 150 and the dummy terminals 160 are formed in the through holes in a later step.

A conductive material (not shown) is then formed in the through holes patterned by the photo resist and on the exposed portions of the seed layer to form the plurality of the connecting terminals 150 on the exposed portions of the seed layer contacting the topmost layer of the metallization layers 124 and to form the dummy terminals 160 on the exposed portions of the seed layer without contacting the topmost layer of the metallization layers 124, for example. In other words, the connecting terminals 150 are electrically connected to the interconnect structure 120, and the dummy terminals 160 are electrically isolated from the interconnect structure 120. In some embodiments, some of the connecting terminals 150 are used to electrically connect other semiconductor components or be electrically grounded. In some embodiments, the dummy terminals 160 are electrically floated or electrically grounded. The disclosed is not limited thereto.

The conductive material may be formed in the through holes patterned by the photo resist by plating (such as electroplating or electroless plating) or the like. The conductive material may comprise a metal, such as copper, aluminum, gold, nickel, silver, palladium, tin, or the like. In some embodiments, the plurality of the connecting terminals 150 and the dummy terminals 160 may be high lead or head-free. The plurality of the connecting terminals 150 and the dummy terminals 160 may be metal pillars (as shown in FIG. 1), ball grid array (BGA) connectors, solder balls, controlled collapse chip connection (C4) bumps, micro bumps, electroless nickel-immersion gold technique (ENIG) formed bumps, electroless nickel-electroless palladium-immersion gold technique (ENEPIG) formed bumps, or the like. In addition, a reflow process may be performed in order to shape the conductive material into the desired bump shapes.

After the plurality of the connecting terminals 150 and the dummy terminals 160 are formed, the photo resist is removed by an ashing or stripping process, such as using an oxygen plasma or the like. Once the photo resist is removed, portions of the seed layer, which is not covered by the conductive material, are removed by using an etching process to form the plurality of the connecting pads 140. In some embodiments, the etching process may be wet or dry etching. However, the disclosure is not limited thereto. In some embodiments, the portions of the seed layer, which is not covered by the conductive material, are removed by using the connecting terminals 150 and the dummy terminals 160 as a mask for performing a self-align patterning process, as so to form the connecting pads 140. In other words, the connecting terminals 150 and the connecting pads 140 underlying thereof share the same pattern, and the dummy terminals 160 and the connecting pads 140 underlying thereof share the same pattern. For example, as shown in FIG. 1, sidewalls of the connecting terminals 150 and the connecting pads 140 underlying thereof are substantially aligned, and sidewalls of the dummy terminals 160 and the connecting pads 140 underlying thereof are substantially aligned.

In some embodiments, as shown in FIG. 1, illustrated top surfaces of the connecting terminals 150 and illustrated top surfaces of the dummy terminals 160 are located at a substantially same height-level to one another. However, the disclosure is not limited thereto; alternatively, the illustrated top surfaces of the connecting terminals 150 may be located at a height level higher than a height-level where the illustrated top surfaces of the dummy terminals 160 located at. The connecting terminals 150 may substantially have the same height to one another, and even as a height difference may exist between any two of the connecting terminals 150, the height difference between any two of the connecting terminals 150 will be in an acceptable tolerance, and thus should be negligible. The acceptable tolerance is, for example, less than 2 µm. As the height difference falls within the acceptable tolerance, the height difference is insignificant and is considered unintentional. Similarly, the dummy terminals 160 may substantially have the same height to one another, and even as a height difference may exist between any two of the dummy terminals 160, the height difference between any two of the dummy terminals 160 will be in an acceptable tolerance, and thus should be negligible. The acceptable tolerance is, for example, less than 2 µm. As the height difference falls within the acceptable tolerance, the height difference is insignificant and is considered unintentional.

In some embodiments, as shown in FIG. 1, the connecting terminals 150 share the same lateral width (or a diameter), the dummy terminals 160 share the same lateral width (or a diameter), where the lateral width of the connecting terminals 150 is greater than the lateral width of the dummy terminals 160. However, the disclosure is not limited thereto; alternatively, the connecting terminals 150 have different lateral widths, in part or all. The dummy terminals 160 have different lateral widths, in part or all. Or alternatively, the lateral width of the connecting terminals 150 is substantially equal to the lateral width of the dummy terminals 160. In further embodiments, some of the connecting terminals 150 have the lateral width greater than, less than or substantially equal to the lateral width of a part or all of the dummy terminals 160. Only four connecting terminals 150 and two dummy terminals 160 are shown in the semiconductor device 100 depicted in FIG. 1 for illustrative purposes and simplicity, and not limited thereto. The number of the connecting terminals 150 and the number of the dummy terminals 160 are not limited to the disclosure, and may be selected and designed based on the demand and design layout/requirement.

Figure 2:
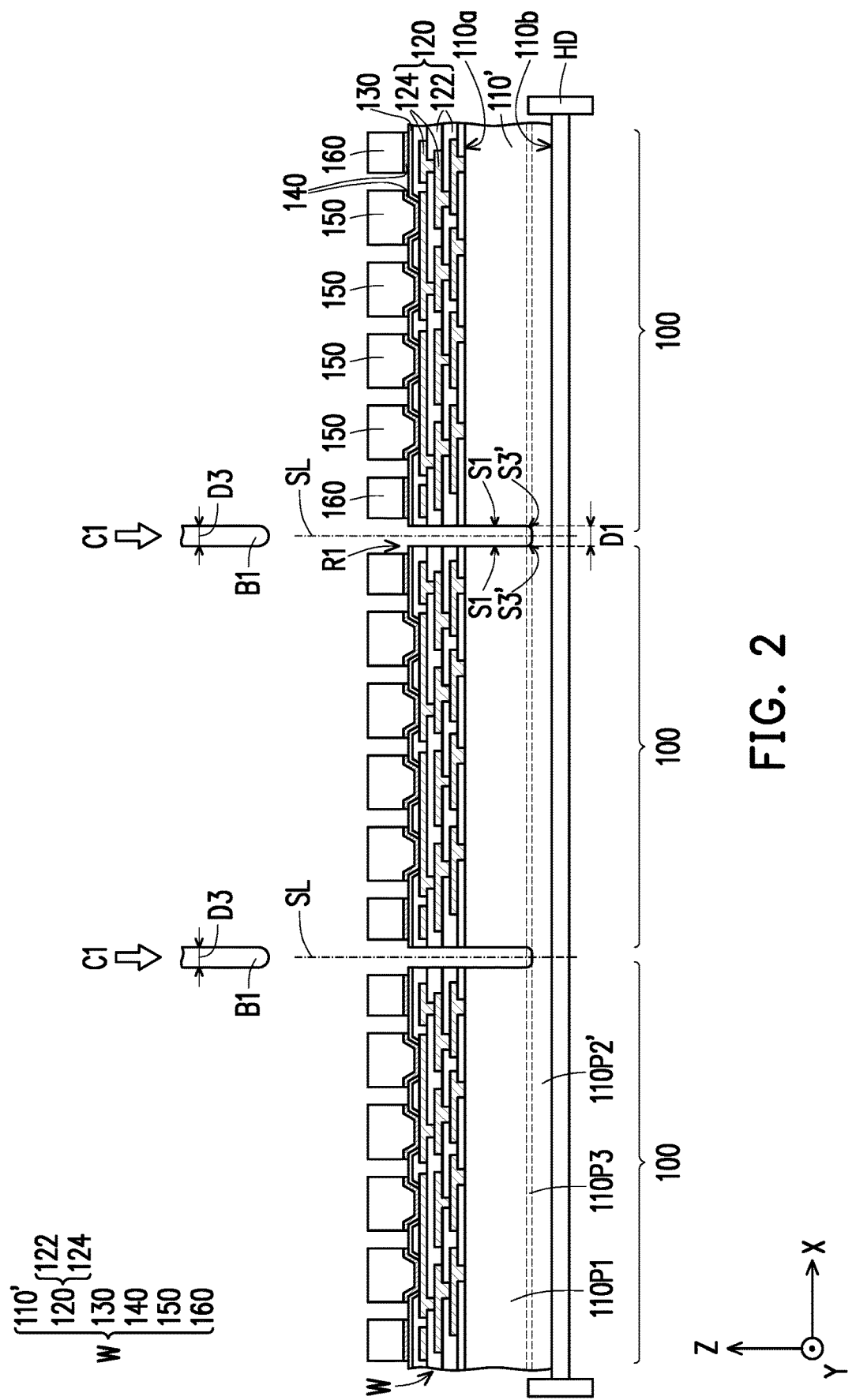

Referring to FIG. 2, in some embodiments, a first cutting process (or step) C1 is performed along the scribe lines SL of the wafer W, such that a plurality of trenches R1 are formed on a front surface of the wafer W, in accordance with a step S20 of FIG. 5. In some embodiments, the first cutting process C1 is performed by a mechanical cutting process with a blade B1 (having a lateral size D3). That is to say, the first cutting process C1 is a contact cutting process. For example, as shown in FIG. 2, the trenches R1 are formed through the interconnect structure 120 and partially through the wafer substrate 110' along the scribe lines SL of the wafer W. In some embodiments, the trenches R1 penetrate through the interconnect structure 120, and further extend through the first sub-portion 110P1' and the third sub-portion 110P3' of the wafer substrate 110' to respectively form a plurality of first portion 110P1 and a plurality of third portion 110P3, in the direction Z. In other words, the portion of the wafer substrate 110', which is not cut through by the trenches R1, is the second sub-portion 110P2' of the wafer substrate 110'. That is, the trenches R1 stop at an illustrated top surface of the second sub-portion 110P2' of the wafer substrate 110'. In some embodiments, the trenches R1 each have a lateral size D1, where the lateral size D1 is approximately ranging from 30 µm to 110 µm.

In some embodiments, each of the trenches R1 has a sidewall S1 (corresponding to the first portion 110P1), where the sidewalls S1 each are a planar surface. As shown in FIG. 2, the sidewalls S1 are substantially vertical, planar sidewalls. However, the disclosure is not limited thereto; alternatively, the sidewalls S1 may be substantially slant, planar sidewalls.

In some embodiments, each of the trenches R1 has a bottom surface S3' (corresponding to the third portion 110P3), where the bottom surfaces S3' each are a curved surface. As shown in FIG. 2, the bottom surfaces S3' are convex surfaces in respect with a plane where the bottom surface 110b located at. In some embodiments, a surface roughness of the bottom surfaces S3' is approximately ranging from 0.05 µm to 1.2 µm.

Before the first cutting process C1, the wafer W is placed onto a holding device HD, in some embodiments. For example, as shown in FIG. 2, the bottom surface 110b of the wafer substrate 110' is attached to the holding device HD, so that the wafer W is secured in place during the first cutting process C1. For example, the holding device HD may be an adhesive tape, a carrier film or a suction pad. The disclosure is not limited thereto.

In some embodiments, before the first cutting process C1, the semiconductor devices 100 included in the wafer W are tested for functionality and performance by probing, and only known good dies (KGDs) from the tested semiconductor devices 100 are selected and used for subsequently processing. Before the first cutting process C1 and before placing the wafer W onto the holding device HD, a pre-thinning process may be further performed on the bottom surface 110b of the wafer substrate 110' of the wafer W for thickness control. Such thickness control may be fulfilled the demand and design layout/requirement, and is not limited thereto.

Figure 3:
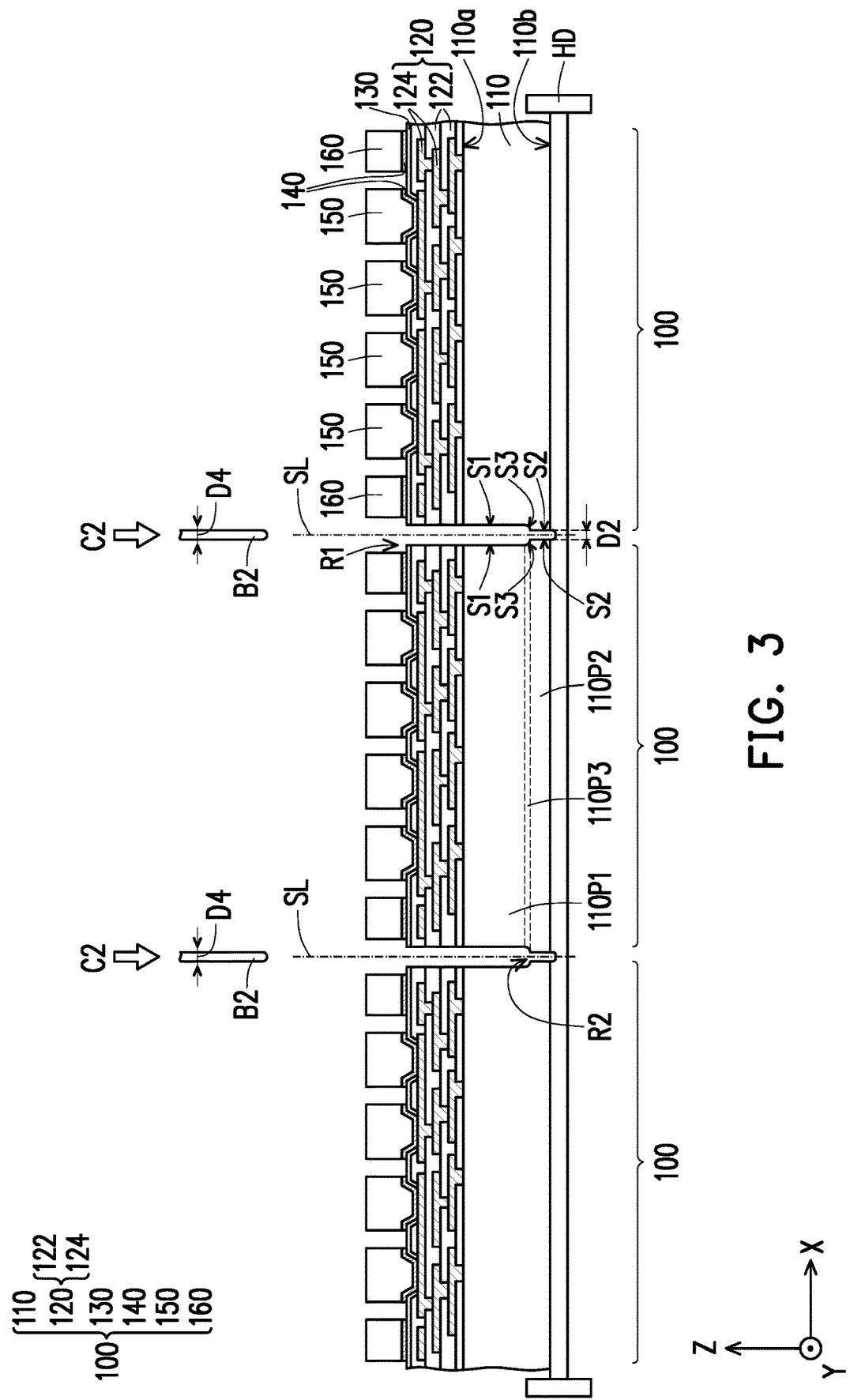

Referring to FIG. 3, in some embodiments, a second cutting process (or step) C2 is performed from the front surface of the wafer W to form a plurality of trenches R2 for sawing the wafer W, so that the (singulated) semiconductor device 100 is formed, in accordance with a step S30 of FIG. 5. For example, the second cutting process C2 is performed on the wafer substrate 110' (e.g. the remaining uncut portion, the second sub-portion 110P2') along the trenches R1 or the scribe lines SL of the wafer W to form a substrate 110, thereby forming separate and individual semiconductor devices 100 (e.g. the singulated semiconductor devices 100). In some embodiments, the second cutting process C2 is performed by a mechanical cutting process with a blade B2 (having a lateral size D4). That is to say, the second cutting process C2 is a contact cutting process. For example, the lateral size D4 of the blade B2 used in the second cutting process C2 is less than the lateral size D3 of the blade B1 used in the first cutting process C1. That is, the cutting width of the first cutting process C1 is greater than the cutting width of the second cutting process C2.

For example, as shown in FIG. 3, the trenches R2 are formed through the wafer substrate 110' and partially through the holding device HD along the scribe lines SL of the wafer W. In some embodiments, the trenches R2 penetrate through the second sub-portion 110P2' of the wafer substrate 110' to form a plurality of second portion 110P2 and further extend into the holding device HD in the direction Z. In other words, the trenches R2 stop in the holding device HD. In some embodiments, the trenches R2 each have a lateral size D2, where the lateral size D2 is approximately ranging from 10 μm to 30 μm. As shown in FIG. 3, for example, the lateral size D2 of the trenches R2 is less than the lateral size D1 of the trenches R1. In some embodiments, the vertical size (or height) of the trenches R1 is greater than the vertical size (or height) of the trenches R2, in direction Z.

In some embodiments, each of the trenches R2 has a sidewall S2 (corresponding to the second portion 1110P2), where the sidewalls S2 each are a planar surface. As shown in FIG. 3, the sidewalls S2 are substantially vertical, planar sidewalls. However, the disclosure is not limited thereto; alternatively, the sidewalls S2 may be substantially slant, planar sidewalls. In some embodiments, each of the trenches R2 in the holding device HD has a curved bottom surface (not labeled). As shown in FIG. 3, the curved bottom surface of each of the trenches R2 is a convex surface in respect with a plane where the bottom surface 110b located at.

Up to this, the semiconductor device 100 is manufactured. In some embodiments, the semiconductor device 100 is a logic chip, such as a central processing unit (CPU), graphics processing unit (GPU), system-on-chip (SoC), system-on-integrated-circuit (SoIC), microcontroller, or the like. However, the disclosure is not limited thereto; in alternative embodiments, the semiconductor device 100 is a digital chip, analog chip or mixed signal chip, such as an application-specific integrated circuit (ASIC) chip, a sensor chips, a wireless and radio frequency (RF) chip, a baseband (BB) chip, a memory chip (such as high bandwidth memory (HBM) dies) or a voltage regulator chip. In further alternative embodiments, the semiconductor device 100 is a chip or an IC of combination-type, such as a WiFi chip simultaneously including both of a RF chip and a digital chip.

Figure 4:
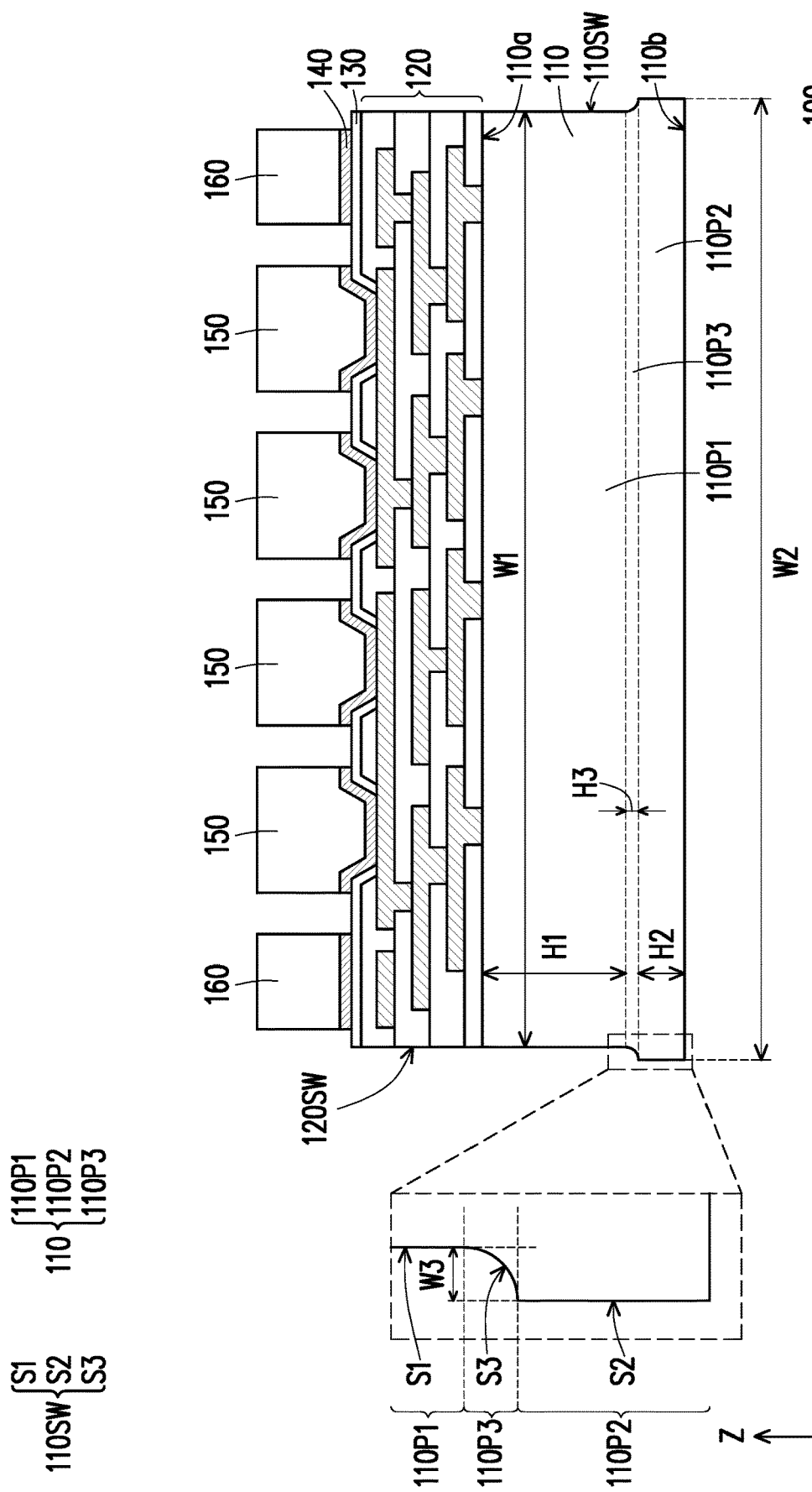
Figure 5:
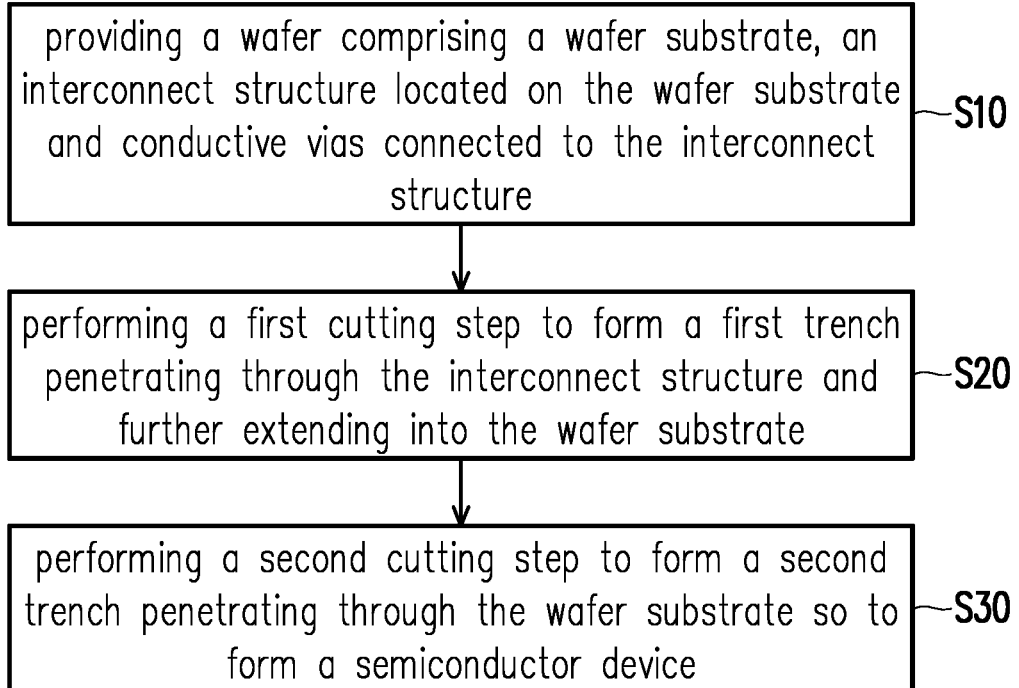
FIG. 5 is a flow chart illustrating a method of manufacturing a semiconductor device in accordance with some embodiments of the disclosure.

As illustrated in FIG. 3 and FIG. 4, one semiconductor device 100 may include the substrate 110, the interconnect structure 120, the passivation layer 130, the connecting pads 140, the connecting terminals 150 and the dummy terminals 160. For example, the interconnect structure 120 is located between the connecting pads 140 and the substrate 110, where the semiconductor components formed in or on the substrate 110 are electrically connected to some of the connecting pads 140 through the interconnect structure 120. The passivation layer 130 may located between the interconnect structure 120 and the connecting pads 140. For example, the connecting terminals 150 are located on and electrically connected to the connecting pads 140 electrically connected to the semiconductor components formed in or on the substrate 110, and the dummy terminals 160 are located on and electrically connected to the connecting pads 140 electrically isolated to the semiconductor components formed in or on the substrate 110. Alternatively, the passivation layer 130 and the dummy terminals 160 may be omitted.

As shown in FIG. 3 and FIG. 4, in some embodiments, the substrate 110 includes the first portion 110P1, the second portion 110P2 and the third portion 110P3 interposed between and connecting the first portion 110P1 and the second portion 110P2. In some embodiments, the first portion 110P1 of the substrate 110 has the sidewall S1, the second portion 110P2 of the substrate 110 has the sidewall S2, and the third portion 110P3 has a sidewall S3, where the sidewall S1 is connected to the sidewall S2 through the sidewall S3 to constitute a sidewall 110SW of the substrate 100. The sidewall S1 of the first portion 110P1 is the sidewall S1 of the trenches R1 as described in FIG. 2, the sidewall S2 of the second portion 110P2 is the sidewall S2 of the trenches R2 as described in FIG. 3, and thus the details thereof are not repeated herein for brevity. As shown in the semiconductor device 100 of FIG. 4, for example, the sidewall S3 of the third portion 110P3 is a curved surface with a radius of curvature approximately ranging from 0.5 μm to 5.0 μm. In some embodiments, the sidewall S1 of the first portion 110P1 is offset from the sidewall S2 of the second portion 110P2 by a distance W3. The distance W3 may be approximately ranging from 0.10 μm to 6.0 μm. That is to say, in the disclosure, the sidewall 110SW of the substrate 100 has a step-form profile in the cross-sectional view along the direction Z.

As illustrated in FIG. 4, for example, the first portion 110P1 has a lateral size W1, and the second portion 110P2 has a lateral size W2, where the lateral size W1 is less than the lateral size W2. In some embodiments, the lateral size W1 of the first portion 110P1 approximately ranges from 5

μm to 50 μm. In some embodiments, the lateral size W2 of the second portion 110P2 approximately ranges from 5.1 μm to 56 μm.

As illustrated in FIG. 4, for example, the first portion 110P1 has a vertical size H1, the second portion 110P2 has a vertical size H2, and the third portion 110P3 has a vertical size H3, where the vertical size H1 is greater than the vertical size H2. For example, the vertical size H1 of the first portion 110P1 is greater than the vertical size of the second portion 110P2 by about 5 μm to 15 μm. In some embodiments, a ratio of a sum of the vertical size H1 and the vertical size H3 to the vertical size H2 (e.g. (H1+H3):H2) is greater than or substantially equal to 2. For example, the ratio, (H1+H3):H2, may be approximately range from 2 to 7. Owing to the sidewall 110SW having the step-form profile with such specific ratio, a chipping at the cutting plane (e.g. the sidewall 110SW) of the substrate 110, which causes damages to the semiconductor components formed in and/or on the substrate 100, is greatly reduced; thereby improving the reliability of the semiconductor device 100. In some embodiments, the vertical size H1 of the first portion 110P1 approximately ranges from 275 μm to 875 μm. In some embodiments, the vertical size H2 of the second portion 110P2 approximately ranges from 125 μm to 350 μm. In some embodiments, the vertical size H3 of the third portion 110P3 approximately ranges from 1 μm to 10 μm. As shown in FIG. 4, a sidewall 120SW of the interconnect structure 120 is substantially aligned with the sidewall S1 of the first portion 110P1 of the substrate 110, for example. That is, the sidewall 120SW of the interconnect structure 120 is offset from, via the distance W3, the sidewall S2 of the second portion 110P2 of the substrate 110.

Figure 6:
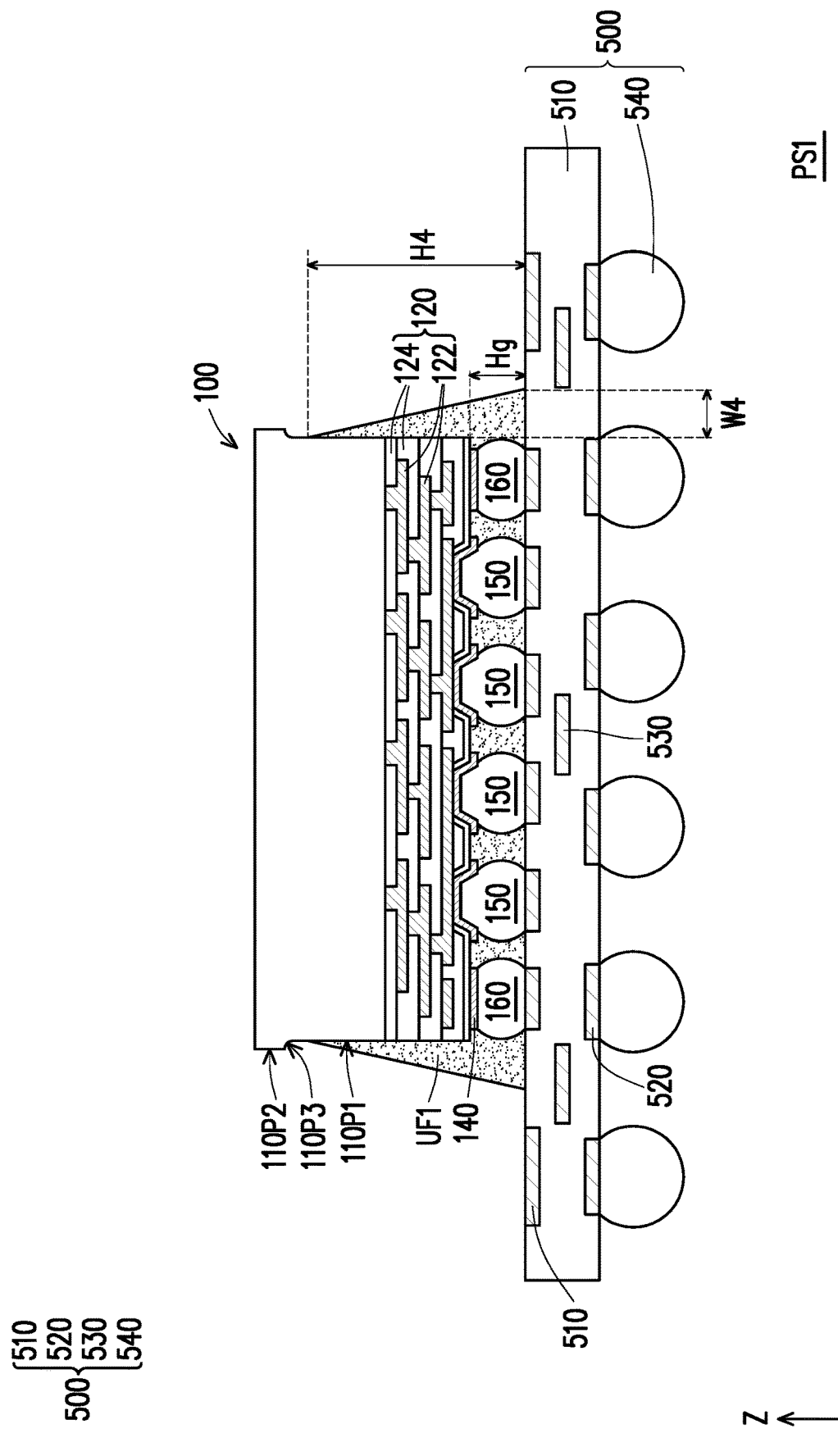
FIG. 6 is a schematic cross-sectional view showing a semiconductor package in accordance with some embodiments of the disclosure.
Figure 7:
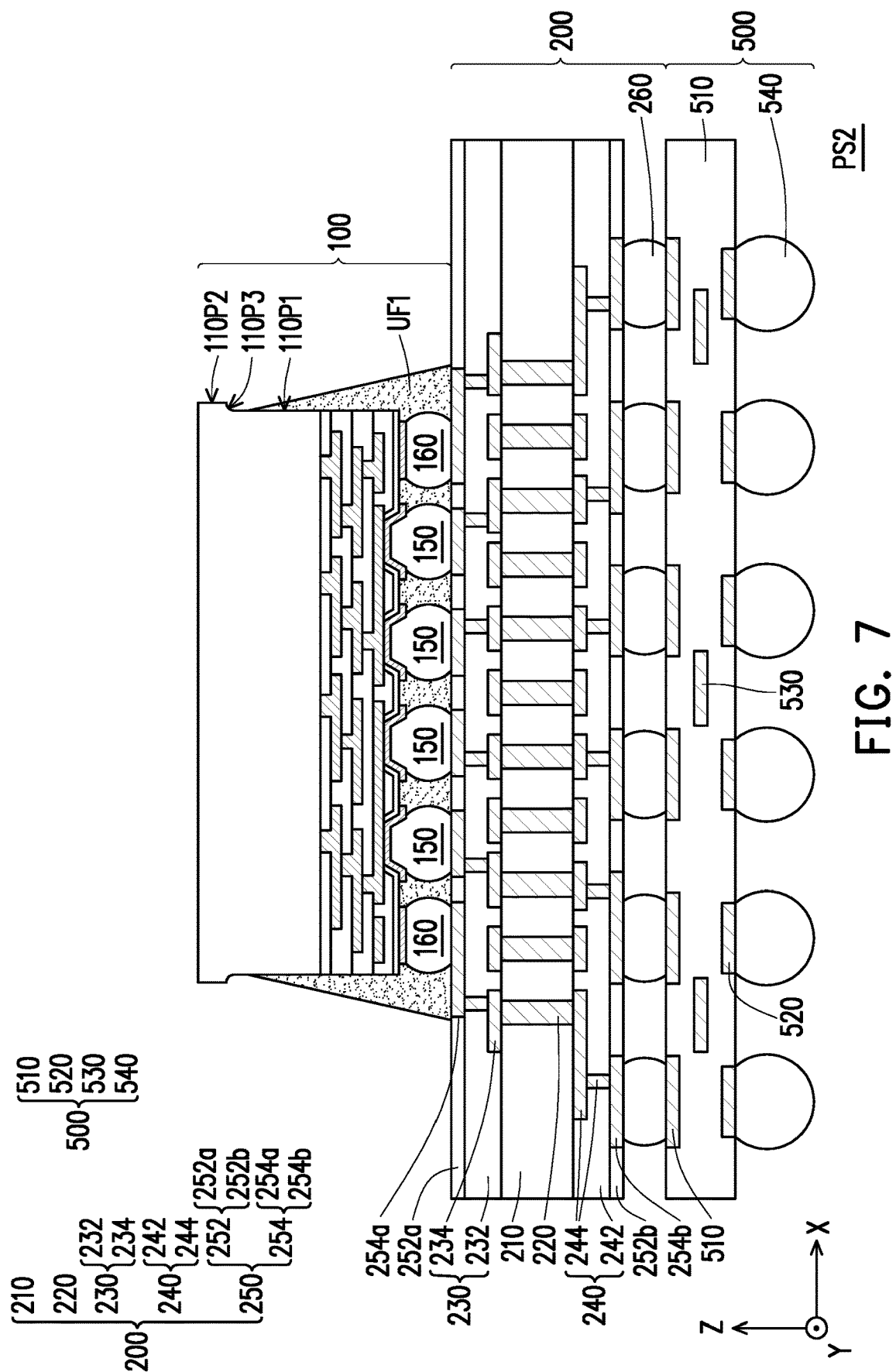
FIG. 7 is a schematic cross-sectional view showing a semiconductor package in accordance with some embodiments of the disclosure.
Figure 8:
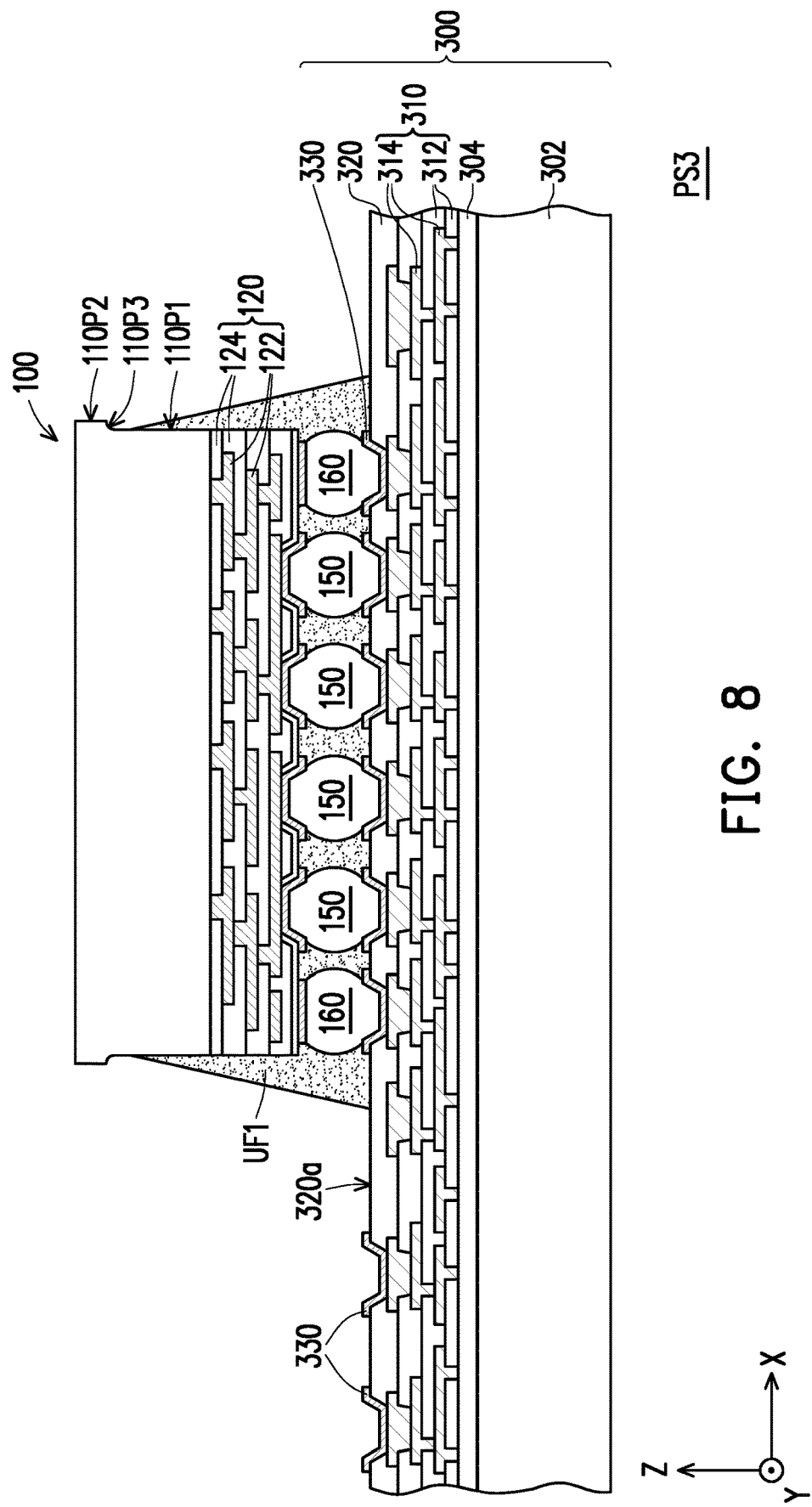
FIG. 8 is a schematic cross-sectional view showing a semiconductor package in accordance with some embodiments of the disclosure.

One or more than one semiconductor device 100 may be mounted to a circuit structure. FIG. 6 through FIG. 8 are schematic cross-sectional views showing a semiconductor package in accordance with some embodiments of the disclosure, where the semiconductor packages (PS1 depicted in FIG. 6, PS2 depicted in FIG. 7 and PS3 depicted in FIG. 8) each include the semiconductor device 100 depicted in FIG. 4. The elements similar to or substantially the same as the elements described previously will use the same reference numbers, and certain details or descriptions (e.g. the materials, formation processes, positioning configurations, etc.) of the same elements would not be repeated herein.

Referring to FIG. 6, in some embodiments, a circuit substrate 500 is provided, where the semiconductor device 100 depicted in FIG. 4 is bonded to the circuit substrate 500 to form the semiconductor package PSI having a stacked structure.

In some embodiments, the circuit substrate 500 includes a substrate 510, contact pads 510, contact pads 520, metallization layers 530 and vias (not shown). In some embodiments, the contact pads 510 and the contact pads 520 are respectively distributed on two opposite sides of the substrate 510 and are exposed for electrically connecting with later-formed elements/features. In some embodiments, the metallization layers 530 and the vias are embedded in the substrate 510 and together provide routing function for the circuit substrate 500, where the metallization layers 530 and the vias are electrically connected to the contact pads 510 and the contact pads 520. That is, at least some of the contact pads 510 are electrically connected to some of the contact pads 520 through the metallization layers 530 and the vias. The substrate 510 may be made of one or more suitable dielectric materials. The contact pads 510 and the contact pads 520 may include metal pads or metal alloy pads. The materials of the metallization layers 530 and the vias may be substantially the same or similar to the material of the metallization layers 124, and thus are not repeated herein for simplicity.

In some embodiments, the circuit substrate 500 further includes a plurality of conductive terminals 540 are respectively formed on the circuit substrate 500. As shown in FIG. 6, for example, the conductive terminals 540 are connected to the contact pads 520 of the circuit substrate 500. In other words, the conductive terminals 540 are electrically connected to the circuit substrate 500 through the contact pads 520. Through the contact pads 510 and the contact pads 520, some of the conductive terminals 540 are electrically connected to the semiconductor device 100. In some embodiments, the conductive terminals 540 are, for example, solder balls or BGA balls. The conductive terminals 540 may be referred to the conductive terminals of the semiconductor package PSI for external connection. However, the disclosure is not limited thereto; alternatively, the conductive terminals 540 may be omitted.

In some embodiments, as shown in FIG. 6, the semiconductor device 100 depicted in FIG. 4 is mounted onto the circuit substrate 500 through physically connecting the connecting terminals 150 and the dummy terminals 160 to the contact pads 510. In some embodiments, the semiconductor device 100 is bonded to the circuit substrate 500 by flip chip bonding. The semiconductor device 100 is physically connected to the circuit substrate 500 through the connecting terminals 150 and the dummy terminals 160, and is electrically connected to the circuit substrate 500 through the connecting terminals 150. The dummy terminals 160 are electrically isolated to the circuit substrate 500. The detail of the semiconductor device 100 is described in FIG. 4, and thus is not repeated herein. In some embodiments, the circuit substrate 500 is referred to as a circuit carrier, such as an organic flexible substrate or a printed circuit board. In such embodiments, the connecting terminals 150 are chip connectors or BGA balls. The semiconductor package PS1 may be referred to as a flip chip package.

In some embodiments, after the semiconductor device 100 is bonded to the circuit substrate 500, an insulating material UF1 is applied to at least fill up the gap (with a height Hg in the direction Z) between the semiconductor device 100 and the circuit substrate 500, and wraps sidewalls of the connecting terminals 150 and the dummy terminals 160. Owing to the insulating material UF1, the bonding strength between the semiconductor device 100 and the circuit substrate 500 is enhanced, thereby improving the reliability of the semiconductor package PS1. The insulating material UF1 may be an underfill made of any acceptable material, such as polymer, epoxy, molding underfill, or the like. The insulating material UF1 may be formed by underfill dispensing or any other suitable method.

Figure 6A:
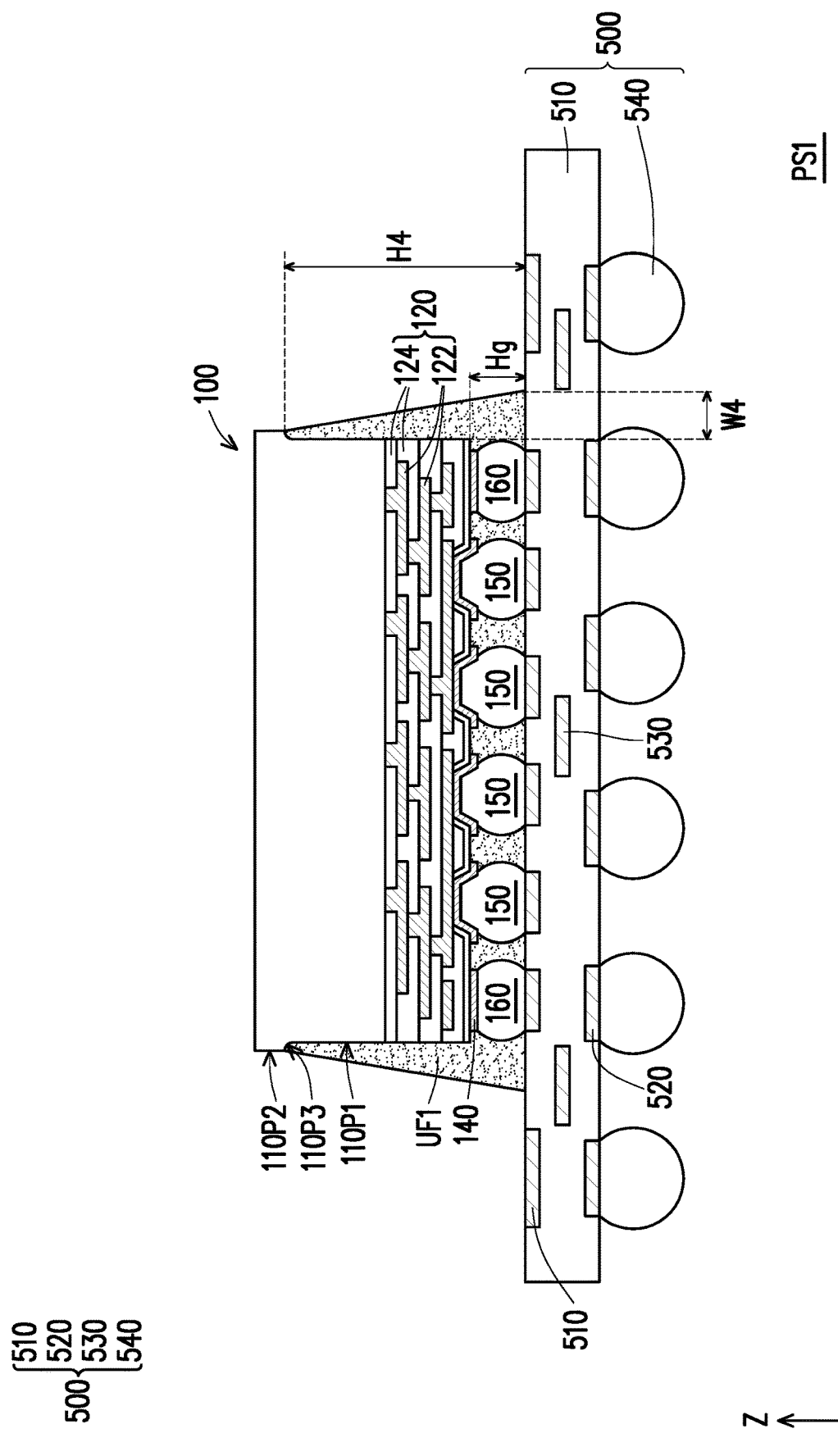
FIG. 6A is a schematic cross-sectional view showing a semiconductor package in accordance with some embodiments of the disclosure.

As illustrated in FIG. 6, for example, the insulating material UF1 is further extended onto the first portion 110P1, where the second portion 110P2 is free from the insulating material UF1. In other words, owing to the step-form profile of the sidewall 110SW, the third portion 110P3 serves as a wall-structure which stops the insulating material UF1 further extending onto the second portion 110P2 from the first portion 110P1. For example, as shown in FIG. 6A, the insulating material UF1 stops at the third portion 110P3. With such, the bottom surface 110b of the semiconductor device 100 is free from the insulating materials, which ensures the heat dissipation of the semiconductor device 100; thereby improving the reliability of the semiconductor package PS1. In addition, owing to the step-form profile of the sidewall 110SW, a better control of a profile of the insulating material UF1 is achieved, thereby obtaining a protection enhancement of the semiconductor package PS1. In some embodiments, the insulating material UF1 may cover the first portion 110P1 by at least 90% to 100% of the vertical size H1 of the first portion 110P1. For example, as shown in FIG. 6, a portion of the insulating material UF1 not overlapped with the interconnect structure 120 in the direction Z has a lateral size W4 approximately ranging from 500 µm to 1200 µm and a vertical size H4 approximately ranging from 300 µm to 1000 µm. In some embodiments, a ratio of the lateral size W4 to the vertical size H4 approximately ranges from 0.5:4.

Referring to FIG. 7, in some embodiments, an interposer 200 is provided, where the semiconductor device 100 depicted in FIG. 4 is bonded on the interposer 200 mounted to the circuit substrate 500 to form the semiconductor package PS2 having a stacked structure. The detail of the semiconductor device 100 is described in FIG. 4, and the detail of the circuit substrate 500 is described in FIG. 6, and thus are not repeated herein. In some embodiments, the interposer 200 includes a core portion 210, a plurality of vias 220, a redistribution circuit structure 230, a redistribution circuit structure 240, a solder mask layer 252a, a solder mask layer 252b, a plurality of bonding pads 254a, and a plurality of bonding pads 254b.

In some embodiments, the core portion 210 includes a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. In some embodiments, the vias 220 are through silicon vias penetrating the core portions 210. The interposer 200 may be referred to as a circuit carrier or a circuit structure, in the disclosure.

In some embodiments, the redistribution circuit structure 230 and the redistribution circuit structure 240 are respectively disposed on two opposite sides of the core portion 210, as shown in FIG. 7. In some embodiments, the redistribution circuit structure 230 and/or the redistribution circuit structure 240 are electrically connected to the vias 220 penetrating the core portion 210. As shown in FIG. 7, the core portion 210 embedded with the vias 220 is located between the redistribution circuit structure 230 and the redistribution circuit structure 240, in some embodiments. Through the vias 220, the redistribution circuit structure 230 and the redistribution circuit structure 240 are electrically connected to each other.

In some embodiments, the redistribution circuit structure 230 includes sequentially forming one or more dielectric layers 232 and one or more metallization layers 234 in alternation, where one metallization layer 234 is sandwiched between two dielectric layers 232. As shown in FIG. 7, portions of a top surface of a topmost layer of the metallization layers 234 are respectively exposed by openings formed in a topmost layer of the dielectric layers 232 for connecting with other conductive features, and portions of a bottom surface of a bottommost layer of the metallization layers 234 are respectively exposed by openings formed in a bottommost layer of the dielectric layers 232 for connecting with the vias 220. The numbers of the metallization layers and the dielectric layers included in the redistribution circuit structure 230 are not limited thereto, and may be designated and selected based on the demand.

In some embodiments, the redistribution circuit structure 240 includes sequentially forming one or more dielectric layers 242 and one or more metallization layers 244 in alternation, where one metallization layer 244 is sandwiched between two dielectric layers 242. As shown in FIG. 7, portions of a top surface of a topmost layer of the metallization layers 244 are respectively exposed by openings formed in a topmost layer of the dielectric layers 242 for connecting with the vias 220, and portions of a bottom surface of a bottommost layer of the metallization layers 244 are respectively exposed by openings formed in a bottommost layer of the dielectric layers 242 for connecting with other conductive features. The numbers of the metallization layers and the dielectric layers included in the redistribution circuit structure 240 are not limited thereto, and may be designated and selected based on the demand.

The materials of the dielectric layers 232 and the dielectric layers 242 may be PI, PBO, BCB, a nitride such as silicon nitride, an oxide such as silicon oxide, PSG, BSG, BPSG, a combination thereof or the like, which may be patterned using a photolithography and/or etching process. In some embodiments, the dielectric layers 232 and the dielectric layers 242 are formed by suitable fabrication techniques such as spin-on coating, CVD, PECVD, or the like. The disclosure is not limited thereto. In one embodiment, the materials of the dielectric layers 232 and the dielectric layers 242 are the same. In an alternative embodiment, the materials of the dielectric layers 232 and the dielectric layers 242 are different.

The material of the metallization layers 234 and the metallization layers 244 may be made of conductive materials formed by electroplating or deposition, such as aluminum, titanium, copper, nickel, tungsten, and/or alloys thereof, which may be patterned using a photolithography and etching process. In some embodiments, the metallization layers 234 and the metallization layers 244 are patterned copper layers or other suitable patterned metal layers. In one embodiment, the materials of the metallization layers 234 and the metallization layers 244 are the same. In an alternative embodiment, the materials of the metallization layers 234 and the metallization layers 244 are different.

In some embodiments, the bonding pads 254a are disposed on a surface of the redistribution circuit structure 230 and physically connected to the portions of the top surface of the topmost layer of the metallization layers 234 exposed by the openings formed in the topmost layer of the dielectric layers 232, where the bonding pads 254a are physically separated from each other through the solder mask layer 252a formed on the surface of the redistribution circuit structure 230 with the bonding pads 254a disposed thereon. Through the redistribution circuit structure 230, the bonding pads 254a are electrically connected to the vias 220 embedded in the core portion 210.

In some embodiments, the bonding pads 254b are disposed on a surface of the redistribution circuit structure 240 and physically connected to the portions of the bottom surface of the bottommost layer of the metallization layers 244 exposed by the openings formed in the bottommost layer of the dielectric layers 242, where the bonding pads 254b are physically separated from each other through the solder mask layer 252b formed on the surface of the redistribution circuit structure 240 with the bonding pads 254b disposed thereon. Through the redistribution circuit structure 240, the bonding pads 254b are electrically connected to the vias 220 embedded in the core portion 210.

As shown in FIG. 7, for example, the bonding pads 254a are electrically connected to the redistribution circuit structure 230 and the bonding pads 254b are electrically connected to the redistribution circuit structure 240. The bonding pads 254a and the bonding pads 254b may include under bump metallurgy (UBM) patterns, however the disclosure is not limited thereto. As shown in FIG. 7, the bonding pads 254a and the bonding pads 254b are electrically connected to each other though the vias 220, the redistribution circuit structure 230, and redistribution circuit structure 240, for example.

Alternatively, the redistribution circuit structure 230 and the redistribution circuit structure 240, one or both, may be omitted from the interposer 200, the disclosure is not limited thereto. That is, for example, the interposer 200 may include a core portion 210, a plurality of vias 220, a plurality of bonding pads 254a, a plurality of bonding pads 254b, a solder mask layer 252a, and a solder mask layer 252b, where the bonding pads 254a and the bonding pads 254b are electrically connected to each other though the vias 220.

In some embodiments, the interposer 200 further includes a plurality of conductive terminals 260 are respectively formed on the bonding pads 254b. As shown in FIG. 7, for example, the conductive terminals 260 are physically connected to the bonding pads 254b. In other words, the conductive terminals 260 are electrically connected to the interposer 200 through the bonding pads 254b. Through the bonding pads 254b, some of the conductive terminals 260 are electrically connected to some of the bonding pads 254a. In some embodiments, the conductive terminals 260 are chip connectors or BGA balls.

Continued on FIG. 7, in some embodiments, the semiconductor device 100 is physically connected to the interposer 200 through connecting the connective terminals 150 and the dummy terminals 160 to the bonding pads 254a of the interposer 200, and the interposer 200 is physically connected to the circuit substrate 500 through connecting the conductive terminals 260 and the contact pads 510 of the circuit substrate 500. In other words, the semiconductor device 100 is electrically connected to the interposer 200 through the connective terminals 150 and the bonding pads 254a, the interposer 200 is electrically connected to the circuit substrate 500 through the conductive terminals 260 and the contact pads 510, so that the semiconductor device 100 is electrically connected to the circuit substrate 500 through the connective terminals 150, the bonding pads 254a, the conductive terminals 260 and the contact pads 510. The dummy terminals 160 are electrically isolated to the interposer 200. In such embodiments, the connective terminals 150 are micro-bumps while the conductive terminals 260 are chip connectors and the conductive terminals 540 are solder balls or BGA balls. The conductive terminals 540 may be referred to the conductive terminals of the semiconductor package PS2 for external connection. In certain embodiments, the semiconductor package PS2 is formed by chip on wafer on substrate (CoWoS) packaging processes. The semiconductor package PS2 may be referred to as a CoWoS package.

In some embodiments, the insulating material UF1 is formed on the interposer 200 to at least fill up the gap between the interposer 200 and the semiconductor device 100, and wraps sidewalls of the connective terminals 150 and the dummy terminals 160. For example, the insulating material UF1 further extends onto the first portion 110P1 of the substrate 110 of the semiconductor device 100, and is free form the second portion 110P2 of the substrate 110. The formation and material of the insulating material UF1 is described in FIG. 6, the configuration/positioning relationship between the insulating material UF1, the semiconductor device 100 and the interposer 200 is similar to the configuration/positioning relationship between the insulating material UF1, the semiconductor device 100 and the circuit substrate 500 as described in FIG. 6, and thus is not repeated herein for brevity. Owing to the insulating material UF1, the bonding strength between the semiconductor device 100 and the interposer 200 are enhanced, thereby improving the reliability of the semiconductor package PS2. In addition, owing to the step-form profile of the sidewall 110SW, a better control of a profile of the insulating material UF1 is achieved, thereby obtaining a protection enhancement of the semiconductor package PS2. Besides, due to the step-form profile of the sidewall 110SW, the reliability of the semiconductor package PS2 is ensured.

Referring to FIG. 8, in some embodiments, a redistribution circuit structure 300 is provided, where the semiconductor device 100 depicted in FIG. 4 is bonded on the redistribution circuit structure 300 to form the semiconductor package PS3 having a stacked structure. The detail of the semiconductor device 100 is described in FIG. 4, and thus is not repeated herein. In some embodiments, the redistribution circuit structure 300 includes a carrier 302, a buffer layer 304, a redistribution layer 310, a solder mask layer 320 and a plurality of bonding pads 330.

In some embodiments, the carrier 302 includes a glass carrier or any suitable carrier for carrying a redistribution layer 310 during manufacturing the redistribution circuit structure 300. In some embodiments, the carrier 302 is provided with a buffer layer 304 coated thereon. For example, the buffer layer 304 includes a debonding layer made of a material suitable for debonding the carrier 302 from the above layers disposed thereon. However, the disclosure is not limited thereto. The carrier 302 and/or the buffer layer 304 may be optional layer(s) that can be omitted, alternatively. In some embodiments, the buffer layer 304 includes a release layer (such as a light-to-heat conversion ("LTHC") layer) or an adhesive layer (such as an ultra-violet curable adhesive or a heat curable adhesive layer).

In some embodiments, the redistribution layer 310 is formed on the buffer layer 304 disposed on the carrier 302. For example, the formation of the redistribution layer 310 includes sequentially forming one or more dielectric layers 312 and one or more metallization layers 314 in alternation. In certain embodiments, as shown in FIG. 8, the metallization layers 314 are sandwiched between the dielectric layers 312, but a top surface of a topmost layer of the metallization layers 314 is exposed from a topmost layer of the dielectric layers 312, and a bottom surface of a bottommost layer of the metallization layers 314 exposed from a bottommost layer of the dielectric layers 312 is directly disposed to the buffer layer 304.

In some embodiments, the material of the dielectric layers 312 includes polyimide, epoxy resin, acrylic resin, phenol resin, BCB, PBO, or any other suitable polymer-based dielectric material. The dielectric layers 312 may be formed by suitable fabrication techniques such as spin-on coating, CVD, PECVD or the like. The dielectric layers 312 may be patterned using a photolithography and etching process. In some embodiments, the material of the metallization layers 314 includes aluminum, titanium, copper, nickel, tungsten, and/or alloys thereof. The metallization layers 314 may be formed by electroplating or deposition. The metallization layers 314 may be patterned using a photolithography and etching process. The number of the dielectric layers 312 and the number of the metallization layers 314 in the redistribution layer 310 is not limited to the disclosure, and may be selected or designated based on the demand and design layout/requirement.

As illustrated in FIG. 8, in some embodiments, the solder mask layer 320 is sequentially formed on the redistribution layer 310. The solder mask layer 320 is disposed on and extends over the redistribution layer 310, where the exposed portions of the topmost layer of the metallization layers 314 are further exposed by a plurality of openings formed in the solder mask layer 320, for example. In some embodiments, the solder mask layer 320 is formed on the redistribution layer 310 by coating and then patterned to form the openings to partially expose the topmost layer of the metallization layers 314, respectively. The patterning process may be performed by photolithography and/or etching processes.

In some embodiments, the bonding pads 330 are formed in the openings formed in the solder mask layer 320 and extends to a surface 320a of the solder mask layer 320. The bonding pads 330 contacts the exposed portions of the topmost layer of the metallization layers 314 further exposed by the openings formed in the solder mask layer 320. That is, the bonding pads 330 are electrically connected to the redistribution layer 310. The bonding pads 330 may be referred to the conductive terminals of the semiconductor package PS3 for external connection. The bonding pads 330 may be referred to as UBMs.

Continued on FIG. 8, in some embodiments, the semiconductor device 100 is physically connected to the redistribution circuit structure 300 through connecting the connective terminals 150 and the dummy terminals 160 to the bonding pads 330 of the redistribution circuit structure 300. In some embodiments, the semiconductor device 100 is bonded to the redistribution circuit structure 300 by flip chip bonding. In other words, the semiconductor device 100 is electrically connected to the redistribution circuit structure 300 through the connective terminals 150 and the bonding pads 330. The dummy terminals 160 are electrically isolated to the redistribution circuit structure 300. In such embodiments, the connective terminals 150 are chip connectors or BGA balls. The semiconductor package PS3 may be referred to as a flip chip package.

In some embodiments, the insulating material UF1 is formed on the redistribution circuit structure 300 to at least fill up the gap between the redistribution circuit structure 300 and the semiconductor device 100, and wraps sidewalls of the connective terminals 150 and the dummy terminals 160. For example, the insulating material UF1 further extends onto the first portion 110P1 of the substrate 110 of the semiconductor device 100, and is free form the second portion 110P2 of the substrate 110. The formation and material of the insulating material UF1 is described in FIG. 6, the configuration/positioning relationship between the insulating material UF1, the semiconductor device 100 and the redistribution circuit structure 300 is similar to the configuration/positioning relationship between the insulating material UF1, the semiconductor device 100 and the circuit substrate 500 as described in FIG. 6, and thus is not repeated herein for brevity. Owing to the insulating material UF1, the bonding strength between the semiconductor device 100 and the redistribution circuit structure 300 are enhanced, thereby improving the reliability of the semiconductor package PS3. In addition, owing to the step-form profile of the sidewall 110SW, a better control of a profile of the insulating material UF1 is achieved, thereby obtaining a protection enhancement of the semiconductor package PS3. Besides, due to the step-form profile of the sidewall 110SW, the heat dissipation and reliability of the semiconductor package PS3 is ensured.

Figure 9:
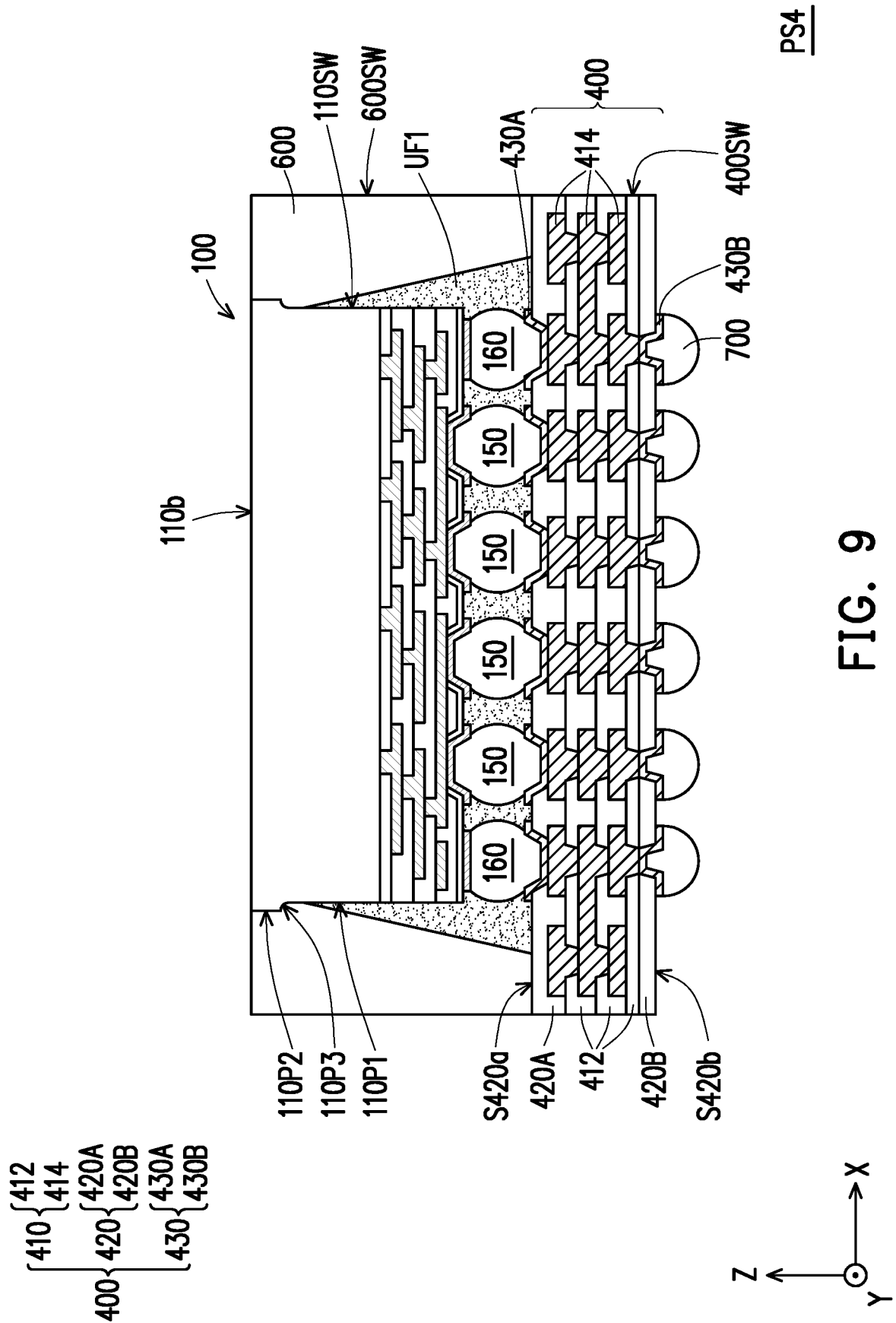
FIG. 9 is a schematic cross-sectional view showing a semiconductor package in accordance with some alternative embodiments of the disclosure.

One or more than one semiconductor device 100 may be packaged to form a package. FIG. 9 is schematic cross-sectional views showing a semiconductor package PS4 in accordance with some embodiments of the disclosure. The elements similar to or substantially the same as the elements described previously will use the same reference numbers, and certain details or descriptions (e.g. the materials, formation processes, positioning configurations, etc.) of the same elements would not be repeated herein. The semiconductor package PS4 may be referred to as an integrated fan-out (InFO) package.

Referring to FIG. 9, in some embodiments, the semiconductor package PS4 includes a semiconductor device 100, a redistribution structure 400, an insulating encapsulation 600, conductive terminals 700 and an insulating material UF1. The semiconductor device 100 is bonded to and electrically connected to the redistribution structure 400, and the insulating materials UF1 at least fills up the gap between the semiconductor device 100 and the redistribution structure 400 and further warps around sidewalls of the connecting terminals 150 and the dummy terminals 160. The semiconductors device 100 is mounted to the redistribution structure 400 by flip chip bonding. In some embodiments, the insulating encapsulation 600 laterally warps the semiconductor device 100 and the insulating material UF1 and covers a surface of the redistribution structure 400 disposed with and exposed by the semiconductor device 100 and the insulting material UF1. As shown in FIG. 9, a sidewall 400SW of the redistribution structure 400 is substantially aligned with a sidewall 600SW of the insulating encapsulation 600, for example. In some embodiments, a bottom surface 110b of the semiconductor device is exposed from the insulting material UF1 and the insulating encapsulation 600, which ensures the heat dissipating of the semiconductor package PS4. Owing to the insulating material UF1 and/or the insulating encapsulation 600, the bonding strength between the semiconductor device 100 and the redistribution structure 400 is enhanced, thereby improving the reliability of the semiconductor package PS4.

As illustrated in FIG. 9, the insulating material UF1 is further extended onto the first portion 110P1, where the second portion 110P2 is free from the insulating material UF1. In other words, owing to the step-form profile of the sidewall 110SW, the third portion 110P3 serves as a wall-structure which stops the insulating material UF1 further extending onto the second portion 110P2 from the first portion 110P1. Owing to the step-form profile of the sidewall 110SW, a better control of a profile of the insulating material UF1 is achieved, thereby obtaining a protection enhancement of the semiconductor package PS4. The detail of the semiconductor device 100 is described in FIG. 4, the detail of the insulting material UF1 are described in FIG. 6, and thus are not repeated herein.

In some embodiments, the insulating encapsulation 600 is a molding compound formed by a molding process. In some embodiments, the insulating encapsulation 600, for example, may include polymers (such as epoxy resins, phenolic resins, silicon-containing resins, or other suitable resins), dielectric materials, or other suitable materials. In an alternative embodiment, the insulating encapsulation 600 may include an acceptable insulating encapsulation material. In some embodiments, the insulating encapsulation 600 may further include inorganic filler or inorganic compound (e.g. silica, clay, and so on) which can be added therein to optimize coefficient of thermal expansion (CTE) of the insulating encapsulation 600. The disclosure is not limited thereto. Alternatively, the insulating encapsulation 600 may be optional, and can be omitted.

In some embodiments, as shown in FIG. 9, the conductive terminals 700 are disposed on and electrically connected the redistribution structure 400, and the redistribution structure 400 is interposed between the semiconductor device 100 and the conductive terminals 700. That is to say, at least some of the conductive terminals 700 are electrically connected to the semiconductor device 100 through the redistribution structure 400. The conductive terminals 700 may be referred to the conductive terminals of the semiconductor package PS4 for external connection. In addition, the formation and material of the conductive terminals 700 is similar to or substantially identical to the formation and material of the conductive terminals 540 (in FIG. 6) or the conductive terminals 260 (in FIG. 7), and thus are not repeated herein for simplicity. Alternatively, the conductive terminals 700 may be optional, and can be omitted.

As illustrated in FIG. 9, in some embodiments, the redistribution structure 400 includes a redistribution layer 410, solder mask layers 420 (including 420A, 420B), and bonding pads 430 (including 430A, 430B). For example, the redistribution layer 410 includes one or more dielectric layers 412 and one or more metallization layers 414 arranged in alternation along the direction Z. In certain embodiments, as shown in FIG. 9, the metallization layers 414 are sandwiched between the dielectric layers 412, where a top surface of a topmost layer of the metallization layers 414 is exposed from a topmost layer of the dielectric layers 412, and a bottom surface of a bottommost layer of the metallization layers 414 is exposed from a bottommost layer of the dielectric layers 414. The formation and material of the dielectric layers 412 is similar to or substantially identical to the formation and material of the dielectric layers 122 (in FIG. 1), the dielectric layers 232 or 242 (in FIG. 7) or the dielectric layers 312 (in FIG. 8), the formation and material of the metallization layers 414 is similar to or substantially identical to the formation and material of the metallization layers 124 (in FIG. 1), the metallization layers 234 or 244 (in FIG. 7) or the metallization layers 314 (in FIG. 8), and thus are not repeated herein for brevity. The number of the dielectric layers 412 and the number of the metallization layers 414 included in the redistribution layer 410 are not limited to the disclosure, and may be selected and designated based the demand and design layout/requirement.

In some embodiments, the solder mask layer 420A and the solder mask layer 420B are formed on two opposite sides of the redistribution layer 410. For example, as shown in FIG. 9, the top surface of the topmost layer of the metallization layers 414 exposed from the topmost layer of the dielectric layers 412 is further exposed by a plurality of openings formed in the solder mask layer 420A for external connections. On the other hand, for example, the bottom surface of the bottommost layer of the metallization layers 414 exposed from the bottommost layer of the dielectric layers 414 is further exposed by a plurality of openings formed in the solder mask layer 420B for external connections.

In some embodiments, the bonding pads 430A are formed in the openings formed in the solder mask layer 420A and extends to a surface S420a of the solder mask layer 420A. The bonding pads 430A contacts the exposed portions of the topmost layer of the metallization layers 414 further exposed by the openings formed in the solder mask layer 420A, for example, as shown in FIG. 9. That is, the bonding pads 430A are electrically connected to the redistribution layer 410.

In some embodiments, the bonding pads 430B are formed in the openings formed in the solder mask layer 420B and extends to a surface S420b of the solder mask layer 420B. The bonding pads 430B contacts the exposed portions of the bottommost layer of the metallization layers 414 further exposed by the openings formed in the solder mask layer 420B, for example, as shown in FIG. 9. That is, the bonding pads 430B are electrically connected to the redistribution layer 410. In other words, some of the bonding pads 430A and 430B are electrically to each other through the redistribution layer 410. The bonding pads 430 (e.g. 430A, 430B) may be referred to as UBMs. As shown in FIG. 9, the conductive terminals 700 are located on the bonding pads 430B, where the bonding pads 430B are located between the conductive terminals 700 and the redistribution layer 410.

As illustrated in FIG. 9, for example, the semiconductor device 100 is mounted onto the redistribution structure 400 through physically connecting the connecting terminals 150 and the dummy terminals 160 to the bonding pads 430A. In some embodiments, the semiconductor device 100 is bonded to the redistribution structure 400 by flip chip bonding. The semiconductor device 100 is electrically connected to the redistribution structure 400 through the connecting terminals 150. The dummy terminals 160 are electrically isolated to the redistribution structure 400. In such embodiments, the connecting terminals 150 are micro-bumps or chip connectors. As shown in FIG. 9, the bonding pads 430A are located between the semiconductor device 100 and the redistribution layer 410.

Figure 10:
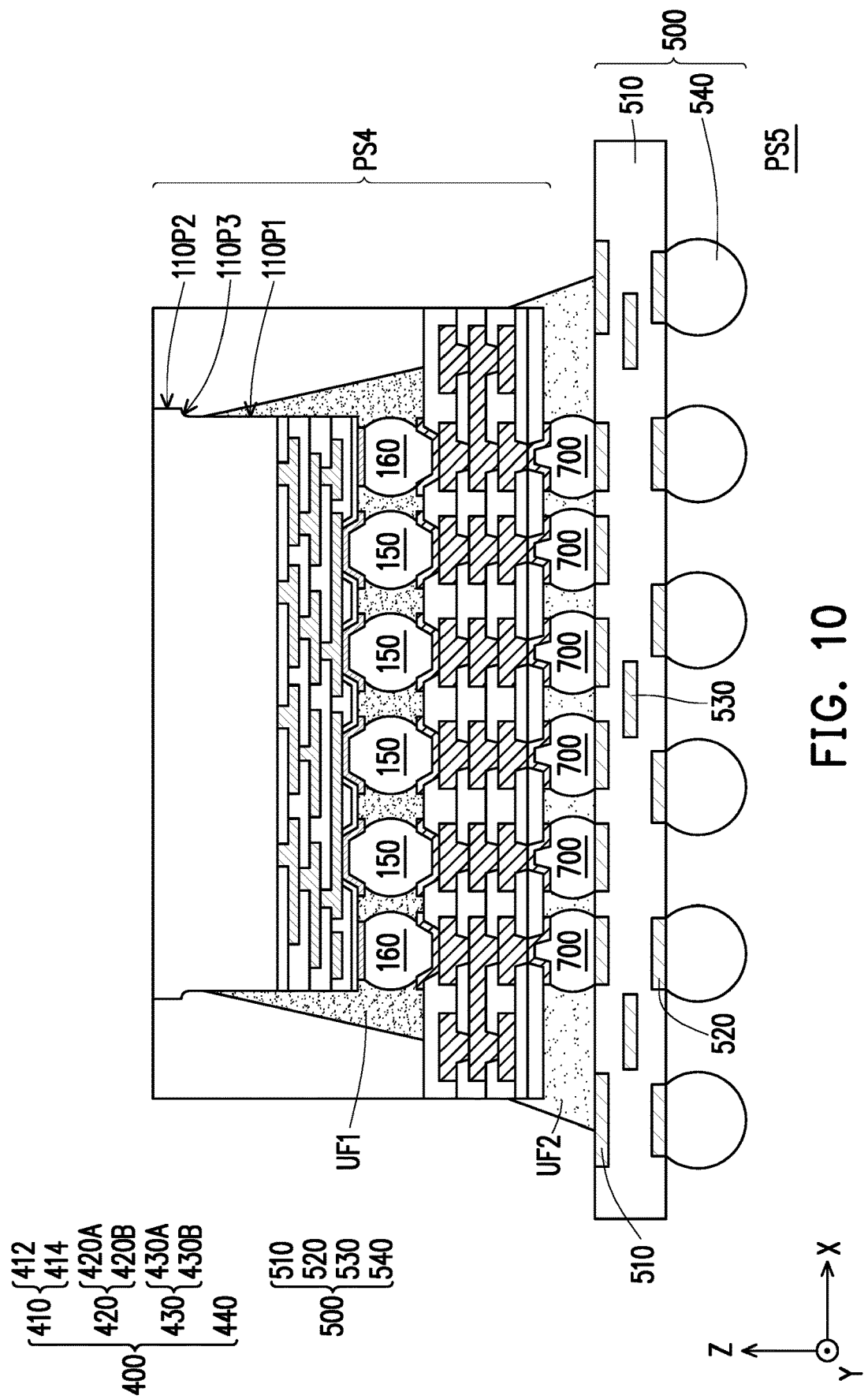
FIG. 10 is a schematic cross-sectional view showing a semiconductor package in accordance with some embodiments of the disclosure.
Figure 11:
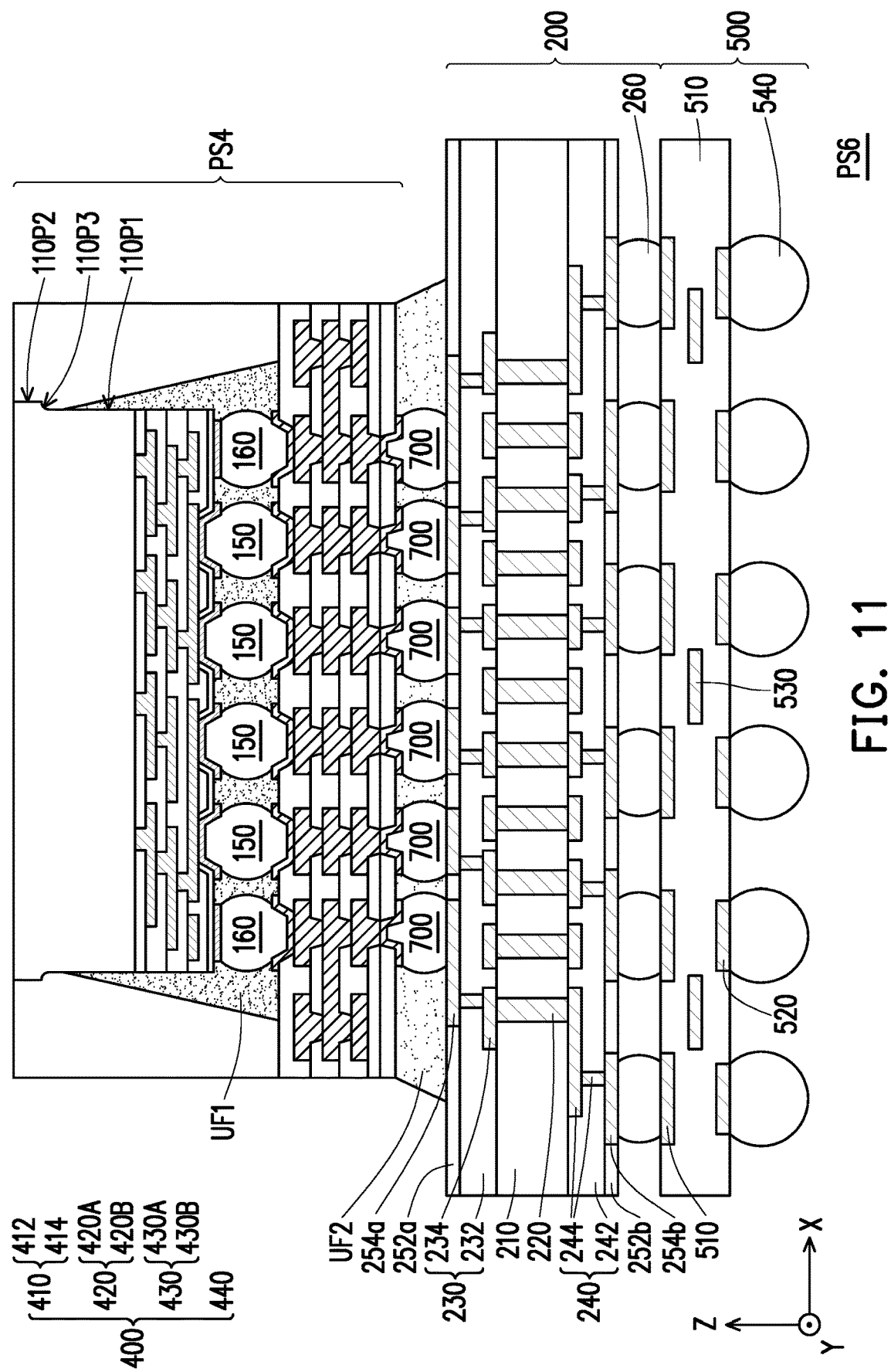
FIG. 11 is a schematic cross-sectional view showing a semiconductor package in accordance with some embodiments of the disclosure.
Figure 12:
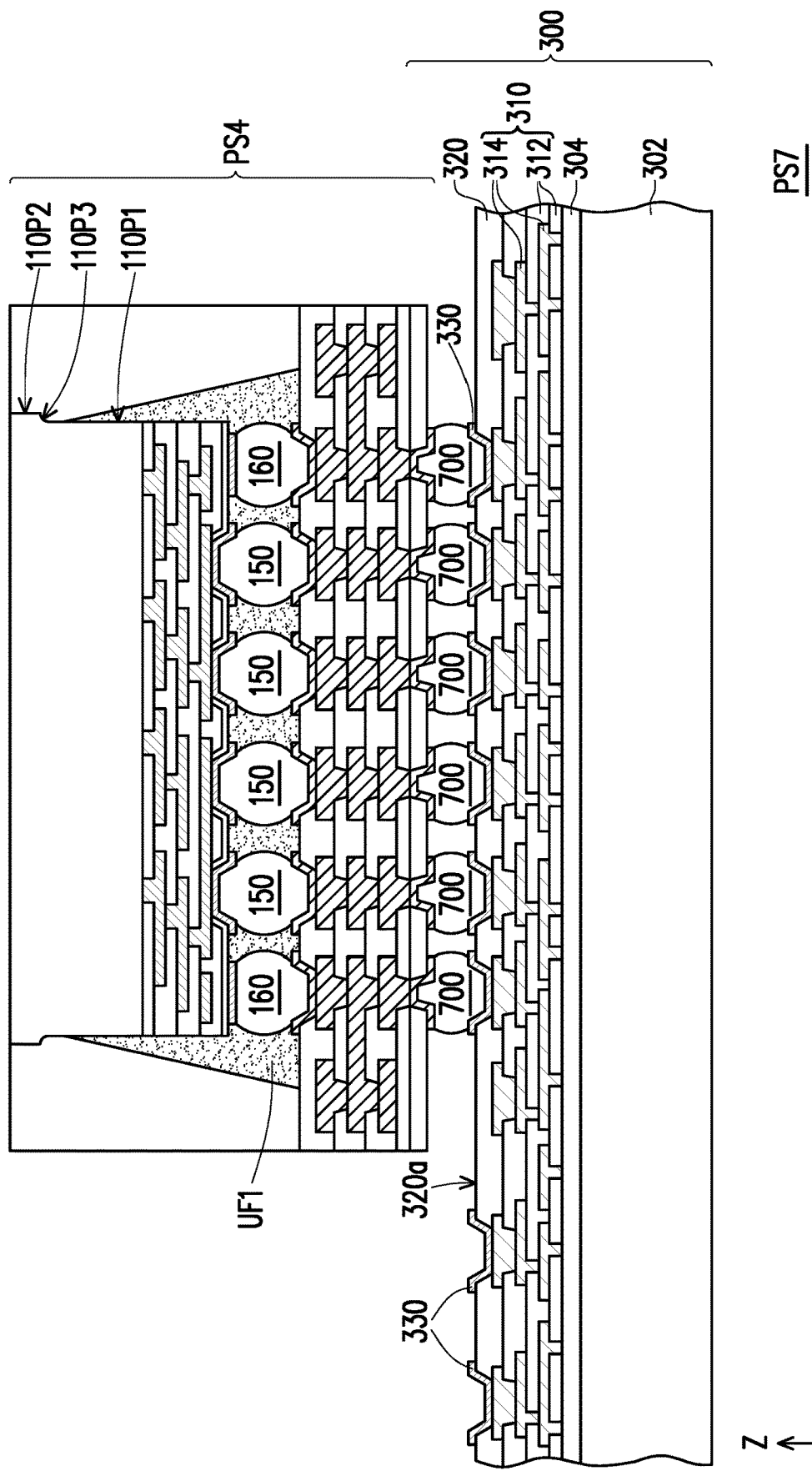
FIG. 12 is a schematic cross-sectional view showing a semiconductor package in accordance with some embodiments of the disclosure.

One or more than one InFO package having at least one semiconductor device 100 may be mounted to a circuit structure. FIG. 10 through FIG. 12 are schematic cross-sectional views showing a semiconductor package in accordance with some embodiments of the disclosure. In some embodiments, the semiconductor package PS4 depicted in FIG. 9 is bonded to a circuit board 500 through connecting the conductive terminals 700 to contact pads 510 of the circuit substrate 500, by a flip chip bonding, to form a semiconductor package having a stacked structure, e.g. a semiconductor package PS5 of FIG. 10. The semiconductor package PS5 may be referred to as a flip chip package. In alternative embodiments, the semiconductor package PS4 depicted in FIG. 9 is bonded to an interposer 200 (bonded to a circuit board 500) through connecting the conductive terminals 700 to bonding pads 254a of the interposer 200, by a CoWoS packaging processes, to form a semiconductor package having a stacked structure, e.g. a semiconductor package PS6 of FIG. 11. The semiconductor package PS6 may be referred to as a flip chip package. In further alternative embodiments, the semiconductor package PS4 depicted in FIG. 9 is bonded to a redistribution circuit structure 300 through connecting the conductive terminals 700 to bonding pads 330 of the redistribution circuit structure 300, by a flip chip bonding, to form a semiconductor package having a stacked structure, e.g. a semiconductor package PS7 of FIG. 12. The semiconductor package PS7 may be referred to as a flip chip package. The detail of the semiconductor package PS4 is described in FIG. 9, the detail of the circuit substrate 500 is described in FIG. 6, the detail of the redistribution circuit structure 300 is described in FIG. 8, and thus are not repeated herein for brevity.

An insulating material UF2 may at least fill up the gap between the conductive terminals 700 and the circuit structure 500 (as shown in FIG. 10), between the conductive terminals 700 and the interposer 200 (as shown in FIG. 11), and/or the conductive terminals 700 and the redistribution circuit structure 300 (as shown in FIG. 12), for example. In one embodiment, the formation and material of the insulating material UF2 may be the same or similar to the formation of the material of the insulating material UF1 described in FIG. 6, the disclosure is not limited thereto. Owing to the insulating material UF2, a bonding strength between the semiconductor package PS4 and the circuit structure 500, between the semiconductor package PS4 and the interposer 200 and between the semiconductor package PS4 and the redistribution circuit structure 300 are enhanced, thereby improving the reliability of the semiconductor packages PS4 through PS7. However, the disclosure is not limited thereto; alternatively, the insulating material UF2 may be optional, and can be omitted.

Figure 13:
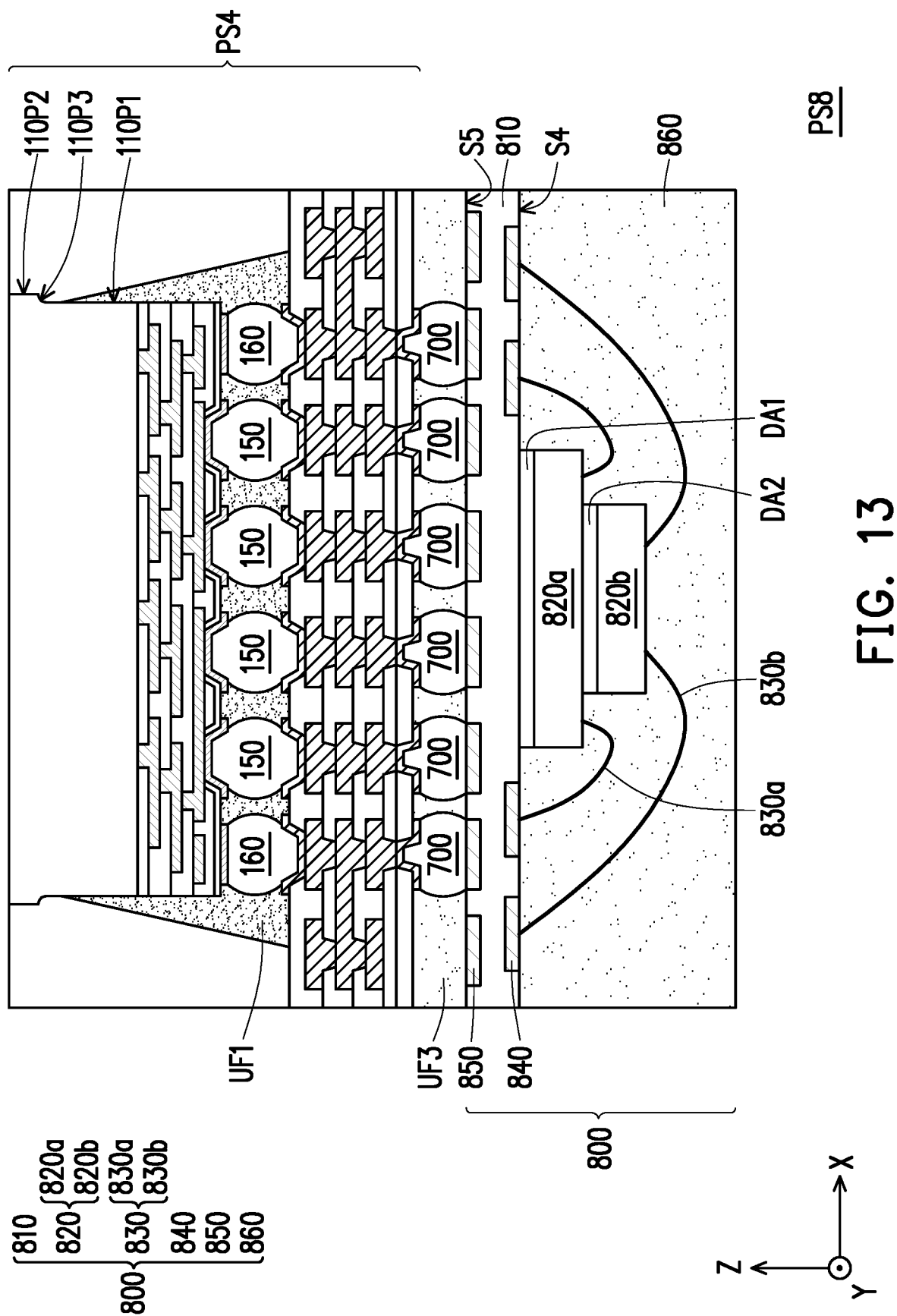
FIG. 13 is a schematic cross-sectional view showing a semiconductor package in accordance with some embodiments of the disclosure.

In addition, one or more than one package (such as a memory package or the like) may be mounted to an InFO package having at least one semiconductor device 100 to form a semiconductor package having a package-on-package (PoP) structure. FIG. 13 is a schematic cross-sectional views showing a semiconductor package PS8 in accordance with some embodiments of the disclosure. The elements similar to or substantially the same as the elements described previously will use the same reference numbers, and certain details or descriptions (e.g. the materials, formation processes, positioning configurations, etc.) of the same elements would not be repeated herein. In other words, the semiconductor package PS8 may be referred to as an InFO-PoP package.

Referring to FIG. 13, in some embodiments, a package 800 is provided and bonded to the semiconductor package PS4 depicted in FIG. 9 to form the semiconductor package PS8 having the PoP structure. The detail of the semiconductor device 100 is described in FIG. 4, the detail of the semiconductor package PS4 is described in FIG. 9, and thus is not repeated herein. In some embodiments, the package 800 has a substrate 810, semiconductor dies 820a and 820b, bonding wires 830a and 830b, conductive pads 840, conductive pads 850, an insulating encapsulation 860, and the joining solder balls (not shown).

As shown in FIG. 13, for example, the semiconductor die 820a with a connecting film DA1 disposed thereon and the semiconductor die 820b with a connecting film DA2 are provided and are disposed on the substrate 810. In some embodiments, the connecting film DA1 is located between the semiconductor die 820a and the substrate 810, and the connecting film DA2 is located between the semiconductor die 820a and the semiconductor die 820b. In some embodiments, due to the connecting films DA1 and DA2 respectively provided between the semiconductor die 820a and the substrate 810 and between the semiconductor dies 820a and 820b, the semiconductor dies 820a, 820b are stably adhered to the substrate 810. In some embodiments, the connecting films DA1, DA2 may be, for example, a die attach film, a layer made of adhesives or epoxy resin, or the like.

For example, the semiconductor dies 820a and 820b are mounted on one surface (e.g. a surface S4) of the substrate 810. The semiconductor dies 820a and 820b may be logic chips (e.g., central processing units, microcontrollers, etc.), memory chips (e.g., dynamic random access memory (DRAM) chips, static random access memory (SRAM) chips, etc.), power management chips (e.g., power management integrated circuit (PMIC) chips), radio frequency (RF) chips, sensor chips, signal processing chips (e.g., digital signal processing (DSP) chips), front-end chips (e.g., analog front-end (AFE) chips, the like, or a combination thereof). The semiconductor dies 820a and 820b are DRAM chips, as shown in FIG. 13, where the package 800 is referred to as a memory package, for example. In one embodiment, the semiconductor dies 820a and 820b may be the same. How-ever, the disclosure is not limited thereto; alternatively, the semiconductor dies 820a and 820b may be different from each other.

In some embodiments, the bonding wires 830a and 830b are respectively used to provide electrical connections between the semiconductor dies 820a, 820b and some of the conductive pads 840 (such as bonding pads) located on the surface S4 of the substrate 810. Owing to the bonding wires 830a and 830b, the semiconductor dies 820a and 820b are electrically connected to the substrate 810.

In some embodiments, the insulating encapsulation 860 is formed on the surface S4 of the substrate 810 to encapsulate the semiconductor dies 820a, 820b, the bonding wires 830a, 830b and the conductive pads 840 to protect these components. In some embodiments, the materials of the insulating encapsulation 860 is the same as the insulating encapsulation 600 as described in FIG. 9, and thus is not repeated herein. In one embodiment, the materials of the insulating encapsulation 860 is different from the insulating encapsulation 600, the disclosure is not limited thereto.

In some embodiments, interconnects (not shown) or through insulator vias (not shown) embedded in the substrate 810 may be used to provide electrical connection between the conductive pads 840 and the conductive pads 850 (such as bonding pads) that are located on another surface (e.g. a surface S5 opposite to the surface S4 the in direction Z) of the substrate 810. In certain embodiments, some of the conductive pads 850 are electrically connected to the semiconductor dies 820a and 820b through these insulator vias or interconnects (not shown) in addition to some of the conductive pads 840 and the bonding wires 830a, 830b.

In some embodiments, the conductive pads 850 of the package 800 are physically connected to the conductive terminals 700 of the semiconductor package PS, and the package 800 is electrically coupled to the semiconductor device 100. In some embodiments, the redistribution structure 400 is electrically connected to the substrate 810 of the package 800 through the conductive terminals 700 and the conductive pads 850. In some embodiments, the semiconductor dies 820a, 820b are electrically communicated to the semiconductor device 100.

In addition, as shown in FIG. 13, an insulating material UF3 fills the gap between the conductive terminals 700 and the substrate 810, for example. In one embodiment, the formation and material of the insulating material UF3 may be the same or similar to the formation of the material of the insulating material UF1 described in FIG. 6, the disclosure is not limited thereto. Owing to the insulating material UF3, a bonding strength between the semiconductor package PS4 and the package 800 are enhanced, thereby improving the reliability of the semiconductor package PS8 depicted FIG. 13.

In accordance with some embodiments, a semiconductor device includes a substrate, an interconnect structure and conductive vias. The substrate has a first side, a second side and a sidewall connecting the first side and the second side, wherein the sidewall includes a first planar sidewall of a first portion of the substrate, a second planar sidewall of a second portion of the substrate and a curved sidewall of a third portion of the substrate, where the first planar sidewall is connected to the second planar sidewall through the curved sidewall. The interconnect structure is located on the first side of the substrate, where a sidewall of the interconnect structure is offset from the second planar sidewall. The conductive vias are located on the interconnect structure, where the interconnect structure is located between the conductive vias and the substrate.

In accordance with some embodiments, a semiconductor package includes a circuit structure, a semiconductor device and an insulating material. The semiconductor device is located on and electrically connected to the circuit structure, and the semiconductor device includes a substrate, an interconnect structure and conductive vias. The substrate has a first portion, a second portion and a third portion connecting the first portion and the second portion, where a vertical size of the first portion of the substrate is greater than a vertical size of the second portion of the substrate along the stacking direction of the first portion, the second portion and the third portion. The interconnect structure is located on the first portion of the substrate. The conductive vias are located on the interconnect structure, where the interconnect structure is located between the conductive vias and the substrate. The insulating material is located between the semiconductor device and the circuit structure, where the insulating material further extends onto the first portion of the substrate.

In accordance with some embodiments, a method of manufacturing a semiconductor device includes the following steps: providing a wafer comprising a wafer substrate, an interconnect structure located on the wafer substrate and conductive vias connected to the interconnect structure, the interconnect structure being located between the wafer substrate and the conductive vias, and the wafer substrate comprising a first sub-portion, a second sub-portion and a third sub-portion connecting therebetween; performing a first cutting step to form a first trench penetrating through the interconnect structure and further extending through the first sub-portion and the third sub-portion of the wafer substrate; and performing a second cutting step to form a second trench penetrating through a second sub-portion of the wafer substrate so to form a semiconductor device comprising a substrate having a sidewall comprising a first planar sidewall of a first portion of the substrate, a second planar sidewall of a second portion of the substrate and a curved sidewall of a third portion of the substrate, wherein the first planar sidewall is connected to the second planar sidewall through the curved sidewall.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
   a substrate having a first side, a second side and a sidewall connecting the first side and the second side, wherein the sidewall comprising a first planar sidewall of a first portion of the substrate, a second planar sidewall of a second portion of the substrate and a curved sidewall of a third portion of the substrate, wherein the first planar sidewall is connected to the second planar sidewall through the curved sidewall;
   an interconnect structure, located on the first side of the substrate, wherein a sidewall of the interconnect structure is offset from the second planar sidewall; and
   conductive vias, located on the interconnect structure, wherein the interconnect structure is located between the conductive vias and the substrate.

2. The semiconductor device of claim 1, wherein the sidewall of the interconnect structure is substantially aligned with the first planar sidewall.

3. The semiconductor device of claim 1, wherein the substrate is a semiconductor substrate having a thickness of 400 µm or more along a stacking direction of the interconnect structure and the substrate.

4. The semiconductor device of claim 1, wherein a lateral size of the first portion of the substrate is less than a lateral size of the second portion of the substrate.

5. The semiconductor device of claim 1, wherein in a stacking direction of the interconnect structure and the substrate, a vertical size of the first portion of the substrate is greater than a vertical size of the second portion of the substrate.

6. The semiconductor device of claim 5, wherein a ratio of a sum of the vertical size of the first portion and a vertical size of the third portion to the vertical size of the second portion is approximately ranging from 2 to 7.

7. The semiconductor device of claim 5, wherein a ratio of a sum of the vertical size of the first portion and a vertical size of the third portion to the vertical size of the second portion is greater than or substantially equal to 2.

8. The semiconductor device of claim 1, wherein the curved sidewall has a radius of curvature approximately ranging from 0.511m to 5.01µm.

9. The semiconductor device of claim 1, wherein the curved sidewall has a surface roughness approximately ranging from 0.05 µm to 1.2 µm.

10. A semiconductor package, comprising:
    a redistribution layer;
    a semiconductor device as claimed in claim 1, located on and electrically connected to the redistribution layer through the conductive vias;
    an underfill, disposed between the redistribution layer and the semiconductor device and wrapping around sidewalls of the conductive vias, wherein the underfill extends onto the first flat sidewall; and
    conductive terminals, located on and electrically connected to the redistribution layer, the redistribution layer being located between the conductive terminals and the semiconductor device.

11. The semiconductor package of claim 10, further comprising:
    a circuit board bonded to and electrically connected to the semiconductor device through the conductive terminals;
    a circuit structure comprising an interposer structure bonded to and electrically connected to the semiconductor device through the conductive terminals and a circuit board bonded to and electrically connected to the semiconductor device through the interposer structure, wherein the interposer structure is located between the semiconductor device and the circuit board;
    a redistribution circuit substrate bonded to and electrically connected to the semiconductor device through the conductive terminals; or
    a sub-package comprising at least one semiconductor die bonded to and electrically connected to the semiconductor device through the conductive terminals.

12. A semiconductor package, comprising:
   a circuit structure;
   a semiconductor device, located on and electrically connected to the circuit structure, and comprising:
      a substrate having a first portion, a second portion and a third portion connecting the first portion and the second portion, wherein a vertical size of the first portion of the substrate is greater than a vertical size of the second portion of the substrate along the stacking direction of the first portion, the second portion and the third portion;
      an interconnect structure, located on the first portion of the substrate; and
      conductive vias, located on the interconnect structure, wherein the interconnect structure is located between the conductive vias and the substrate; and
   an insulating material, located between the semiconductor device and the circuit structure, wherein the insulating material further extends onto the first portion of the substrate.

13. The semiconductor package of claim 12, wherein a ratio of a sum of a first vertical size of the first portion and a third vertical size of the third portion to a second vertical size of the second portion is greater than or substantially equal to 2.

14. The semiconductor package of claim 12, wherein the second portion is free of the insulating material.

15. The semiconductor package of claim 12, wherein the circuit structure comprises:
   a circuit substrate, bonded to the semiconductor device through the conductive vias, wherein the insulating material wraps around sidewalls of the conductive vias and is in contact with circuit substrate; and
   conductive terminals, located on and electrically connected to the circuit substrate, the conductive terminals being electrically connected to the semiconductor device through the circuit substrate, wherein the circuit substrate is located between the conductive terminals and the semiconductor device.

16. The semiconductor package of claim 12, wherein the circuit structure comprises:
   an interposer structure, bonded to and electrically connected to semiconductor device through the conductive vias, wherein the insulating material wraps around sidewalls of the conductive vias and is in contact with the interposer structure; and
   a circuit substrate, having first conductive terminal disposed thereon and bonded to and electrically connected to the interposer structure through second conductive terminals, wherein the circuit substrate is located between the first conductive terminals and the second conductive terminals,
   wherein the second conductive terminals are located between the interposer structure and the circuit substrate.

17. The semiconductor package of claim 12, wherein the circuit structure comprises:
   a redistribution circuit structure, bonded to the semiconductor device through the conductive vias, wherein the insulating material wraps around sidewalls of the conductive vias and is in contact with the redistribution circuit structure.

18. A method of manufacturing a semiconductor device, comprising:
   providing a wafer comprising a wafer substrate, an interconnect structure located on the wafer substrate and conductive vias connected to the interconnect structure, the interconnect structure being located between the wafer substrate and the conductive vias, and the wafer substrate comprising a first sub-portion, a second sub-portion and a third sub-portion connecting therebetween;
   performing a first cutting step to form a first trench penetrating through the interconnect structure and further extending through the first sub-portion and the third sub-portion of the wafer substrate; and
   performing a second cutting step to form a second trench penetrating through a second sub-portion of the wafer substrate so to form a semiconductor device comprising a substrate having a sidewall comprising a first planar sidewall of a first portion of the substrate, a second planar sidewall of a second portion of the substrate and a curved sidewall of a third portion of the substrate, wherein the first planar sidewall is connected to the second planar sidewall through the curved sidewall.

19. The method of claim 18, wherein:
   performing the first cutting step to form the first trench is prior to performing the second cutting step to form the second trench, and a lateral size of the first trench is greater than a lateral size of the second trench.

20. The method of claim 18, wherein:
   performing the first cutting step forms the first portion and the third portion of the substrate comprised in the semiconductor device with a first height of the first trench formed in the substrate; and
   performing the second cutting step forms the second portion of the substrate comprised in the semiconductor device with a second height of the second trench formed in the substrate, wherein a ratio of the first height to the second height is greater than or substantially equal to 2.

* * * * *